United States Patent [19]

Wenger et al.

[11] Patent Number: 4,926,789

[45] Date of Patent: May 22, 1990

[54] TRANSPORT APPARATUS FOR BOARDS

[75] Inventors: Hartmut Wenger, Pratteln; Peter Martin, Basel; Hans Rotzinger, Kaiseraugst; Martin Denz, Basel, all of Switzerland

[73] Assignee: Ciba-Geigy Corporation, Ardsley, N.Y.

[21] Appl. No.: 252,302

[22] Filed: Oct. 3, 1988

[30] Foreign Application Priority Data

Oct. 13, 1987 [CH] Switzerland .................. 3995/87

[51] Int. Cl.⁵ .................. B05C 1/02; B65G 37/00
[52] U.S. Cl. .................. 118/668; 118/677; 118/58; 118/72; 198/465.1; 198/803.8; 198/470.1
[58] Field of Search ............. 198/470.1, 803.8, 803.01, 198/465.1; 118/58, 668, 314, 324, 423, 500, 503, 72, 209, 322, 427

[56] References Cited

U.S. PATENT DOCUMENTS

| | | | |
|---|---|---|---|
| 2,342,032 | 5/1941 | Geffroy | 118/503 |
| 2,695,595 | 11/1954 | Hagerman | 118/58 |
| 3,124,485 | 3/1964 | Kaulen | 118/58 |
| 3,204,756 | 9/1965 | Lesch | 198/803.01 |
| 3,245,376 | 4/1966 | Romstadt | 118/58 |
| 4,178,079 | 12/1979 | Sara | 118/58 |
| 4,344,380 | 8/1982 | Matsumiya et al. | 118/324 |
| 4,421,800 | 12/1983 | Schoenberg et al. | 118/314 |
| 4,672,914 | 6/1987 | Sari | 118/500 |
| 4,695,482 | 9/1987 | Weiswurm | 118/314 |
| 4,848,533 | 7/1989 | Martin et al. | 198/803.8 |

FOREIGN PATENT DOCUMENTS

| | | |
|---|---|---|
| 542608 | 6/1957 | Canada ............... 198/470.1 |
| 6832716.9 | 3/1984 | Fed. Rep. of Germany . |
| 2439734 | 5/1980 | France . |
| 1497766 | 1/1978 | United Kingdom . |

Primary Examiner—Willard Hoag
Attorney, Agent, or Firm—Harry Falber

[57] ABSTRACT

A transport apparatus for boards or workpieces in board form, for example printed circuit boards which are to be coated with plastic, for example UV curable plastic, has advancing means for the transport of the boards and grippers or clamps for seizing the board edges during the transport and advancement of the boards. In order to avoid a risk of damaging the sensitive board surfaces, in particular when transferring the boards from one conveyor to the other, the gripper or grippers or clamps is/are attached to a holding element or rack, releasably coupled to the transporting or advancing means of the apparatus. This holding element remains connected, via its grippers to the board during the complete transport of the latter and can be transferred and reloaded together with the board held by it at transitions from one advancing means to another or from one processing station to the other. The handling of the boards is thus in practice directed instead to its holding elements and consequently the risk which this handling entails is kept away from the boards.

18 Claims, 17 Drawing Sheets

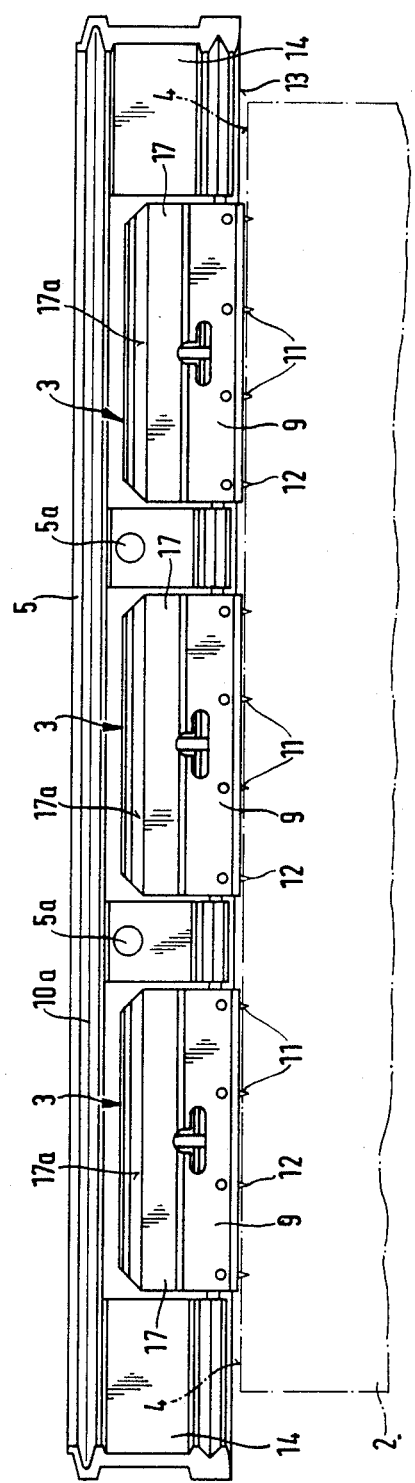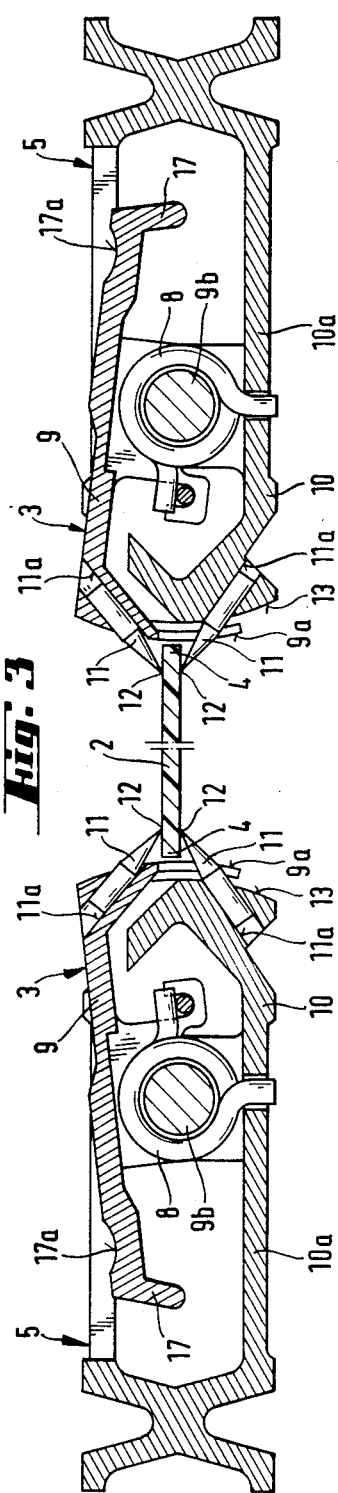
Fig. 2
Fig. 3

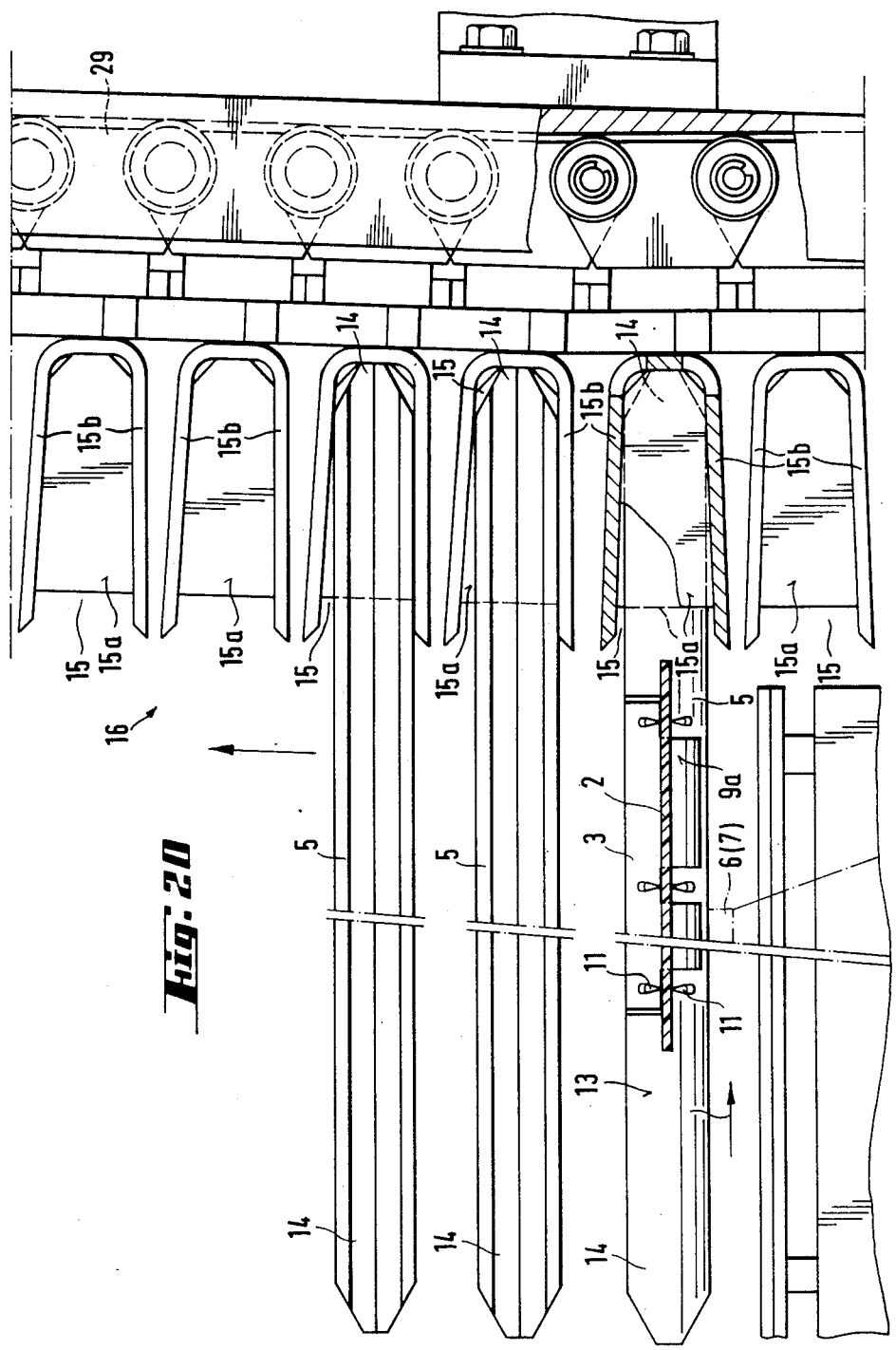

TRANSPORT APPARATUS FOR BOARDS

FIELD OF THE INVENTION

The invention relates to a transport apparatus for boards or workpieces in board form, particularly boards or workpieces with sensitive surfaces, such as printed circuit boards or the like which are coated with a curable liquid plastics moulding compound, for example a lacquer curable by ultra-violet light, and which are preheated before coating, coated and then dried.

DESCRIPTION OF THE PRIOR ART

Various sorts of apparatus for the transport of boards which are designed to make allowances for keeping the surfaces of the boards unharmed are known. This is necessary in particular if wet-coated printed circuit boards are to be transported from coating stations to drying stations. Such printed circuit boards are namely coated with a protective lacquer, which is firstly dried, then exposed to light, then removed by developing at the exposed points. As a result, the conductor tracks can then be provided at these pre-selected points with electric contacts. Before coating such boards have to be cleaned, preheated, then coated, subsequently exposed to air and finally dried. Another problem in this case is that generally both surfaces of the board have to be coated and correspondingly treated, the coating on the first surface not having hardened as yet during the coating of the second surface, thus being susceptible to damage.

A system for the conveyance of materials in board form but flexible, such as printed products, for example newspapers, periodicals and the like, is known from DE-A-25 25 496, in which carriers lying transversely to the direction of advancement or conveyance are connected by spring-loaded gripping devices arranged at their ends to an endless conveying line on a circulating conveyor chain and the gripping devices clasp the edge region of the printed products while a middle region is supported. This would not be usable for the transport of freshly coated boards, because not only is a very large edge region seized by the grippers, meaning that the coating could already be impaired there, but because the supporting device could damage the not yet hardened coating of the one side of the board. Furthermore, such an apparatus is only suitable for a certain conveying line, while the transition from one conveying element to another, for example at the transition from one processing station to the other, is difficult and requires the boards to be siezed at other points which are not engaged by the grippers of the first conveying apparatus.

A transport apparatus for circuit boards with printed circuits which has an endless conveyor with chain drive is known from FR-A-2 439 734, in which the boards are fitted in upwardly open slots in the region of the upper side of this conveying element, so that their surfaces are oriented approximately vertically. In this arrangement, consequently only one longitudinal board edge is clasped in each case. However, such a conveyor element would be unsuitable for freshly coated boards, because then the liquid on the board surface would at least partially run off and corresponding trails and tears could form. Furthermore, provision must be made again at the transfer points to and from this conveyor for a corresponding relative movement between conveyor element and board in order to be able to bring the board out of the conveyor element to a further work station, so that again additional grippers or the like have to engage the boards.

An apparatus with two parallel-running conveying means, which have opposing V-shaped profiled holders is known from EP-A-0,224,440. These holders hold the horizontally lying boards at their edges and transport them through the processing station. In particular at the loading and unloading stations, at the transition from one processing station to the next, the known prior art does not disclose corresponding gentle acceptance devices for the boards.

An acceptance is known for example from DE-G-83 27 161.9 (Pat. 6-16-86. In this case of this device, the board is held at its edges by two grippers. A plurality of spacers are necessary to prevent a lateral tilting of the boards. These lateral spacers frequently lead to damage of the coating on freshly coated boards. In addition, this device can only be used for small boards of a certain minimum thickness. Printed circuit boards of usual thickness (0.8 mm) and size bow and thus slip out of the grippers.

Further difficulties occur with the previously known devices if boards of different dimensions have to be successively transported on them.

OBJECT OF THE INVENTION

The object then therefore exists of creating an apparatus for the transport of such boards of the type mentioned at the beginning which allows a gentle seizing and transporting of the boards, it also being intended for the transition from one processing station to the next to be able to take place simply and without additional stressing of the board edges. At the same time, the apparatus is also to make it possible, if necessary, to transfer the boards in different directions and also to be able to carry out a change in the advancement from a horizontal conveying direction to an upwardly and/or downwardly directed conveying direction, and vice versa, so that the space necessary for the various processing stations can be kept as small and as space saving as possible, without there being the risk that the sensitive board surfaces could be damaged by additional grippers, contact devices or the like during these various transfers and changes of direction.

SUMMARY OF THE INVENTION

The surprising solution, according to the invention, achieving this apparently contradictory object, consists in that the gripper or grippers or clamps is/are attached to a holding element which can be coupled releasably to the transporting or advancing means of the apparatus, and in that this holding element remains connected, via its gripper(s) to the board during the complete transport of the latter and can be transferred or reloaded together with the board held by it at transitions from one advancing means to another or from one processing station to the other.

Accordingly one aspect of the present invention provides in apparatus for treating workpieces in the form of boards and comprising a plurality of stations at which operations are performed on the workpieces, a transport system, comprising advancing means for advancing the workpieces from station to station and through each station, holding elements for the workpieces, gripping means incorporated in each holding element and adapted to grip a workpiece and hold it relative to the holding element, and means releasably coupling a holding element to the advancing means, the advancing means serving to advance the workpiece through the apparatus while engaging only the holding element which holds the workpiece by means of its gripping means, whereby the workpiece can be advanced through the apparatus, being transported from one station to another, without coming into direct contact with the advancing means.

The invention thus provides for the corresponding grippers or clamps for seizing the boards' edges no longer to be attached to the advancing means and transport elements as a component part of the same, but to be designed as separate parts which can be individually handled and, after seizing the board edges, always remain connected to the board during transport over a very wide variety of transport lines, so that the changing transporting actions and the handling operations necessary thereby, in particular the engagements of new advancing means, can always take place on this holding element, in other words the board and in particular its sensitive surface, can remain unaffected by all of these measures. Thus, during transport, and in particular during transferring of the board, the board itself is no longer newly seized and transferred in each case, instead this takes place in each case with the holding elements, which remain connected to the respective board or the respective boards. Consequently, in practice, a transport apparatus is created in which the grippers and clamps to be carried by the individual transporting and advancing means are no longer constant parts of these transporting and advancing means but are only seized and transported by the latter when necessary in each case, but otherwise can also be passed on. Consequently, couplings of the most varied types of horizontal, directionally deviating and even upwardly and downwardly directed advancing means can successively engage these holding elements in each case, which also greatly facilitates the transition from one advancing means to the next.

It is particularly expedient in this case if two parallel holding elements with at least one gripper in each case are provided for the two longitudinal edges of a board which are oriented in the direction of advancement, can be adjusted during seizing of the board over its entire width and can then be coupled to transporting and/or advancing means brought into corresponding positions. The separation of the holding elements from the advancing means can thus also facilitate and simplify the adaptation to different board dimensions. An individual advancing means may namely be provided for each holding element of a board edge, so that the distance of this parallel advancing means can be changed very easily to the different board dimensions by the adjustment of one or both advancing means towards each other or away from each other, which is not possible, or is only possible with very complex means, in the case of the previously known endless conveyors with integrated clamps for two board edges.

A solution which is particularly simple in terms of structural design is obtained if an advancing means for the holding element of the one board edge within the transport apparatus has a path and orientation which is stationary and remains stationary and the second advancing means for the second holding element can be moved in a lateral direction relative to the first so as to be able to accommodate in each case the width of the board to be processed. Consequently, in the adaptation to different board dimensions, only one path of advancement need ever be adapted.

For a defined and always constant fixing of the position of the respective board during its holding on the holding element, it may be expedient if the clamp or the gripper on the holding element has two jaws or the like which can move relative to each other and can spread away from each other against a restoring force, one of which jaws is connected immovably to a housing of the holding element or is integral with the latter, while the other jaw can be pivoted open and closed. Consequently, in practice a fixed holding plane is produced within the clamp, since it is not the case that two pivotal clamps or jaws can in some circumstances reach their respective closed position in somewhat different pivoting attitudes.

In order, during seizing of the boards, to have to engage as little of the surface of this board as possible but to achieve nonetheless a secure and firm hold, it is advantageous if the jaws of the gripper or grippers of the holding element have in each case at least two, preferably pointed, projections which are arranged with a space apart each other in the longitudinal direction of the board edge and are directed against the board surfaces, respectively corresponding projections of the two jaws in each case lying approximately opposite each other with their tips. Such pointed projections as parts of the jaws which ultimately contact the longitudinal board edges can, due to the very small area loaded by them, engage very close to the longitudinal board edge, but nonetheless generate a high holding force. Consequently, they can remain far enough outside the region of a board that a safety margin from the region which is to be coated with lacquer or plastics still remains, which has the additional advantage that these grippers or clamps can also be protected in a simple way against being soiled by lacquer or plastics.

It would be conceivable to provide holding elements of different lengths and, in particular, holding elements with differently dimensioned grippers, for commonly used board sizes. It is even more advantageous, however, if a plurality of grippers, at least two or three, are arranged on a holding element one behind the other in the direction of advancement and the direction of the longitudinal extent of the holding element, which together engage a large board or, if appropriate, in each case engage a small individual board. Consequently, such a holding element can be used universally both for large boards and for small boards and a holding element of uniform dimensions can thus always be coupled and connected to the various transporting and advancing means.

A particularly advantageous configuration of the invention for the possibility of trouble-free transition of the boards from an approximately horizontal conveying apparatus into an upwardly and downwardly directed conveying apparatus may consist in that the holding element projects beyond the region of the gripper or grippers which are on it in the direction of its longitudinal extent by a coupling end for the pushing or insertion into a pocket-shaped receptacle of an upwardly or downwardly leading transporting means. With an appropriate arrangement of a horizontal conveyor relative to such an upwardly leading, for example perhaps a paternoster-like, conveyor it then follows virtually of its own accord that the holding element can be coupled by the advancing movement on the horizontal transporting means automatically, to the receptacle of this new transporting means.

In order to be able in this case, after a subsequent transition again onto a horizontal transporting means, to use once again such an upwardly directed transporting means, it is advantageous here if both ends of the holding element project as coupling ends beyond the region fitted with grippers.

The use of a transferable holding element for seizing the board edges during the transport of the board also makes a very simple structural design possible for these holding elements, it being possible nonetheless, without complex additional acceptance and transfer grippers or the like, to transfer this holding element very easily from one transporting means to the other, simply by corresponding coupling regions being provided on the one hand for the horizontal transport and on the other hand for the vertical transport. In this case, the development of utilizing the ends of the holding elements which are extended with respect to the gripping regions as plug couplings for corresponding pocket-shaped receptacles of an upwardly and downwardly directed conveyor is attributed increased significance due to the simplicity and yet great effectiveness of this solution.

Developments of the apparatus with regard to the sides of the gripper jaws facing the respective seized longitudinal board edges, the configuration of the movable clamping jaw, the arrangement of the holding elements at the beginning of a transport apparatus in the feed region of the boards as well as sensors and the like provided there for fully automatic operation are described in detail hereinafter with reference to the drawings together with possibilities as to how the lateral alignment and positioning of the boards can also take place very simply at the end faces of the clamping jaws with dimensional precision for the later processing operations necessary, and how the holding elements, to be handled separately from the individual conveyors and advancing means, can, at the beginning of the respective transporting operation, be brought together with the boards to be seized by them.

Carriages or the like to which the holding elements can be releasably coupled may be provided as advancing means for the holding elements. This produces particularly precise forward movements without the possible occurrence of independent movements, such as can occur in conveyor belts and the like. In this case, the carriage for the holding element for the one longitudinal edge of the board may be adjustable with its advancing drive transversely to the direction of advancement and the adjusting drive may be driven by one or more of the optoelectronic sensors for the sensing of the board size in the feed region of the overall apparatus. The adaptation, already mentioned, of the advancing means to the respective board dimensions can in this case be implemented particularly simply by the use of carriages as advancing means, because a carriage track has an adequate inherent rigidity to be able also to be pushed sideways well and precisely.

The configurations of the lower side and upper side of the holding element and the matching upper side of the advancing carriage and the coupling means provided in this region are adapted for the temporary releasable connection of the holding elements to the carriage. In particular, the use of index bolts on the carriage and matching coupling openings on the holding elements produce on the one hand the precise and positionally accurate releasable coupling between carriage and holding element without overly splitting up the holding element on its surfaces and thereby excessively hampering its handling and also its storage and stacking, for example in magazines.

For the trouble-free transition from the carriage into a paternoster-like conveyor, already mentioned, with receptacles for the coupling ends of the holding element, it is expedient if the coupling end of the holding element which points in the direction of advancement projects beyond the carriage in the direction of advancement as plug coupling for the releasable connection to the upwardly and downwardly directed conveyor, within a preheating chamber. Consequently, the carriage can stop at a sufficient distance from this further, upwardly directed advancing means and nonetheless transfer the holding element in a trouble-free manner. At the same time, it is advantageous here that such an upwardly and downwardly directed conveyor is arranged inside a preheating chamber, so that a sufficiently long dwell time can be achieved for preheating for the respective holding element and, in particular, the boards held therein, without on the one hand the conveying flow of the fully automatic transport from one processing station to the next having to be slowed, but nonetheless, in an advantageous way, only very little space in longitudinal direction of the overall apparatus being used for this time in the preheating chamber with, seen in relative terms, virtually uniform speed of advancement. This possibility of achieving the preheating in a confined space by an upward and downward conveyance is made possible in this case by the advantageous design of the holding element with coupling possibilities on the one hand on its lower side and upper side and on the other hand at its ends.

To avoid again in this case, complex clamps, grippers or the like on the upwardly and downwardly directed conveyor and at the same time to be able to design the coupling ends on the holding element as simple and smooth as possible, which also benefits the transition, already mentioned, from the carriage to this conveyor, by the final advancing movement of the carriage being able to serve for the insertion of the coupling end of the holding element into the receptacle of the conveyor, the conveyor accepting the holding elements with the board or boards from the horizontally led carriages can have an upwardly leading run and a run leading downwards again over a return roller and the pocket-shaped or U-shaped receptacles carried by these runs are in this case expediently arranged at regular intervals alongside one another or one above the other, into which receptacles the coupling elements of the holding elements fit and can be inserted so deep that, in the upward movement, the pivoting movement in the region of the upper return and the subsequent downward movement, the two parallel holding elements projecting out of the receptacles with the gripping regions and the board or boards are fixed by the frictional forces generated by the restraining moment. Thus, in practice, the connection of the holding elements to these receptacles is made adequately secure over a sufficiently large insertion depth. Special clamps, spreading elements or other coupling means to be operated and to be moved can thus be spared in an advantageous way, which not only facilitates the coupling of the holding elements into these pocket-shaped receptacles, but similarly on the other hand makes the transfer from these receptacles back to approximately horizontally displaceable conveying means, in particular carriages, trouble-free and simple.

One configuration of the overall apparatus with its own significance worthy of protection may in this case consist in that the upwardly leading run and/or the downwardly loading run of the upward and downward conveyor or conveyors of the apparatus are inclined at an acute angle to the vertical in such a way that the two runs have a smaller distance from each other in the upper region of the conveyor than in the lower region. As a result, the runs therefore do not run precisely in vertical direction but are inclined slightly obliquely thereto. This has the considerable advantage that a certain play is possible at the plug connections between holding element and receptacle, without the holding elements which project on one side of the run hanging down obliquely with their free end in each case during their upwardly and downwardly directed transport. Consequently, the insertion is facilitated, the production of the coupling connection is made cheaper by the greater possibilities for tolerances and nonetheless a good security of this simple plug coupling is achieved during the entire transport. This oblique arrangement of the runs can be achieved most simply by the upper return roller or roll of the conveyor having a smaller diameter than the lower return and the two runs being arranged symmetrically to a vertical plane through the axes of the two returns. As a result, it is ensured at the same time that the holding elements are aligned approximately horizontally in each case both before and after their upper return, due to a substantially symmetrical design of their coupling ends relative to a horizontal plane at the two runs.

The configurations of the U-shaped or pocket-shaped receptacles are advantageous in particular for maintaining the positioning of the boards in a precise attitude in the direction of advancement, but also for a trouble-free adaptation to different dimensions of boards.

These measures concern the inclination of the runs to a vertical, to obtain there by as accurate a horizontal alignment of the holding elements as possible during their transport upwards and downwards again.

At the lower end region of the upwardly leading run of the conveyor there may be provided a horizontal guide track with carriages or the like for acceptance of the holding elements with the boards, which track leads to an application device for protective or solder-resist lacquer or plastics, within which preferably the upwardly facing side of the board is coated with this lacquer or plastics. At the same time, in this application device there may be provided a lacquer limiter, which is driven by optoelectronic sensors, preferably those at the inlet into the device, and prevents a lacquer application on the holding elements and the grippers which are on them.

The horizontal guide track may lead through the lacquer application device into a drying chamber, in which an upward and downward conveyor - corresponding to the upward and downward conveyor in the preheating chamber - may be arranged, the advancing speed and the height of this conveyor being chosen such that the lacquer layer on the upper side of the board is dried during the transport upwards to such an extent that it no longer runs during turning and downward conveyance.

The advantageous conveying principle with the aid of the holding elements to be transferred from one conveying element and advancing means to the next with the boards makes it possible that a further horizontal guide track with carriages or the like adjoins in the lower transfer region of the downwardly leading run of the conveyor of the drying chamber and the downwardly conveyed holding elements can be coupled to carriages arranged there and can be conveyed into a further lacquer-application device, which preferably corresponds to the first lacquer-application device. The space-saving conveyor of the drying chamber with an upwardly directed and downwardly directed run namely turns the board as a matter of course on this conveying path, so that the not yet coated surface of the board is directed upwards of its own accord at the end of this conveyor, so that it can be transported trouble-free into a downstream further lacquer application station, so that the various work stations can thus be of a structurally virtually identical design.

The second lacquer-application device may be adjoined by at least one further drying chamber with an upward and downward conveyor—which can again correspond in an advantageous way to the conveyors of the type already mentioned, with respect to couplings and acceptance and surrender of the holding elements——and a delivery track may be arranged behind this drying chamber or at least a further drying chamber.

Thus the overall result is a conveying path for the boards, the main feature of which consists not in that the boards are transferred in each case from one conveying means to the next but in that this happens with holding elements which remain constantly connected to the boards. In this case, virtually only two sorts of advancing or conveying means are necessary, namely those required for a horizontal movement and those required for an upward and downward movement giving the overall apparatus a space-saving design, which has the further advantage that the coupling points necessary in each case may be arranged separately from one another on the holding element and may also be assigned to one another in the direction of advancement in such a way that the respective movements of the horizontal conveying means may ensure the coupling and uncoupling on the upwardly and downwardly directed conveyor.

Further developments of the overall appartus, in particular in its delivery, with possibilities of bringing the then no longer required holding elements back into the initial position to be able to transport boards once again with them, are described.

The overall result is a transport apparatus which has as its essential component a holding element whereby the boards to be transported are seized and then always remain connected during transport and treatment with a wide variety of transporting means and in a wide variety of work stations, so that the board surfaces are kept unharmed and the couplings and holders presenting a risk for the boards are directed instead at the holding elements. This makes possible the expedient and space-saving arrangements mentioned of different work station, so that for example printed circuit boards can be coated on both sides with plastic or lacquer virtually automatically.

DETAILED DESCRIPTION OF THE DRAWINGS

Figure 1:
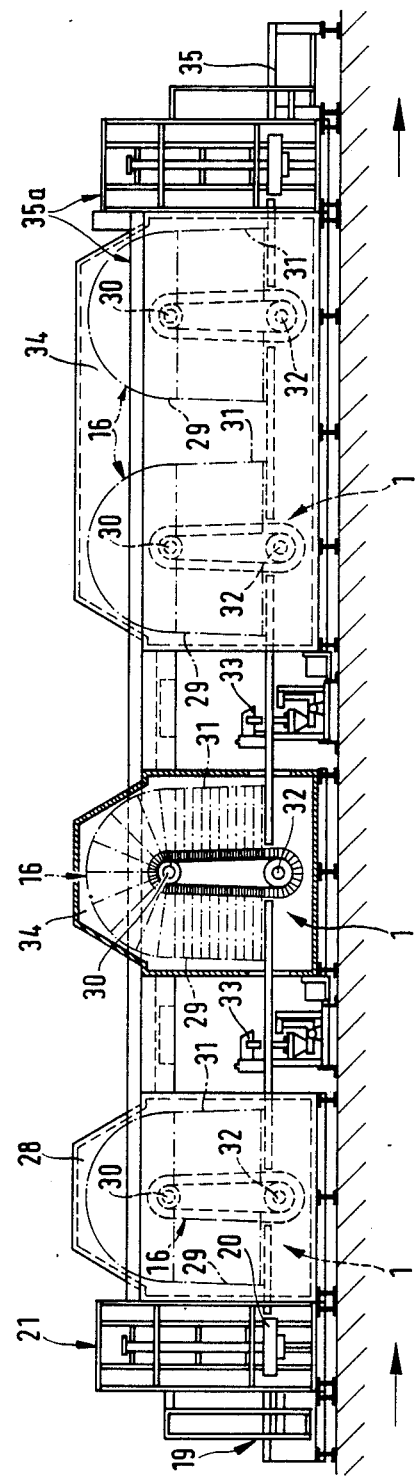
Figure 4:
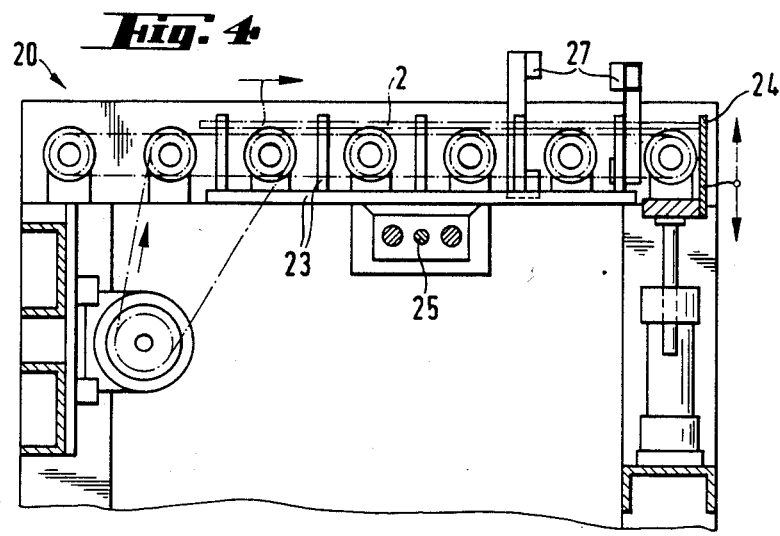
Figure 5:
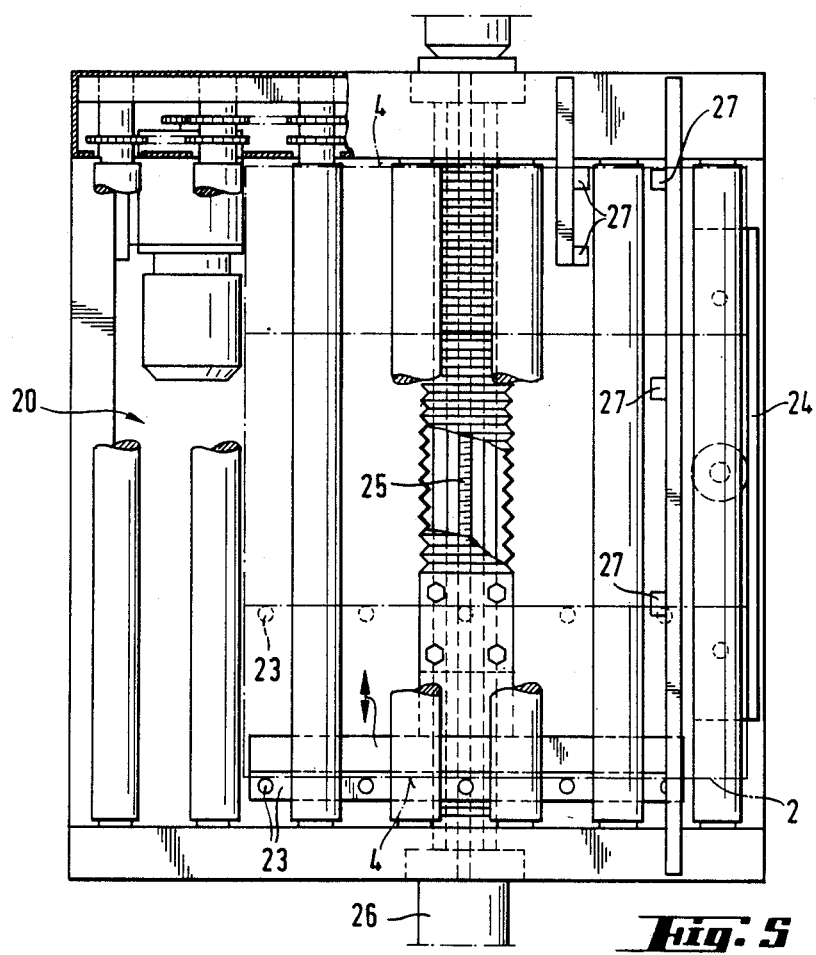
Figure 6:
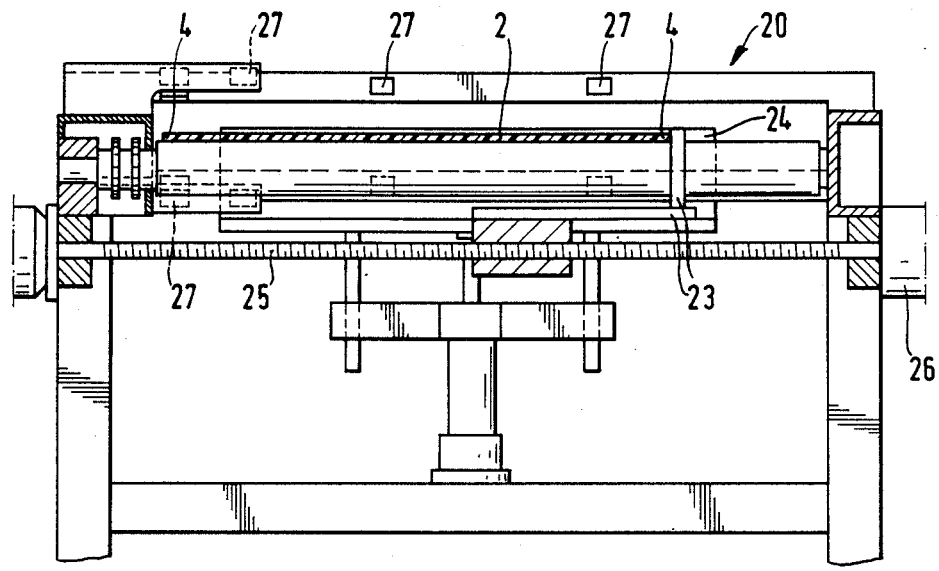
Figure 7:
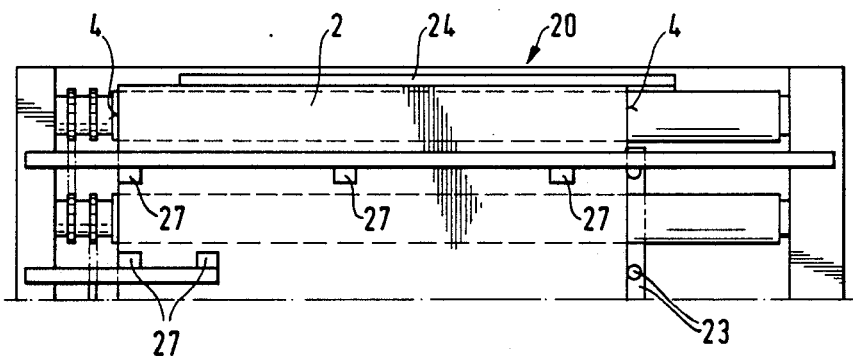
Figure 8:
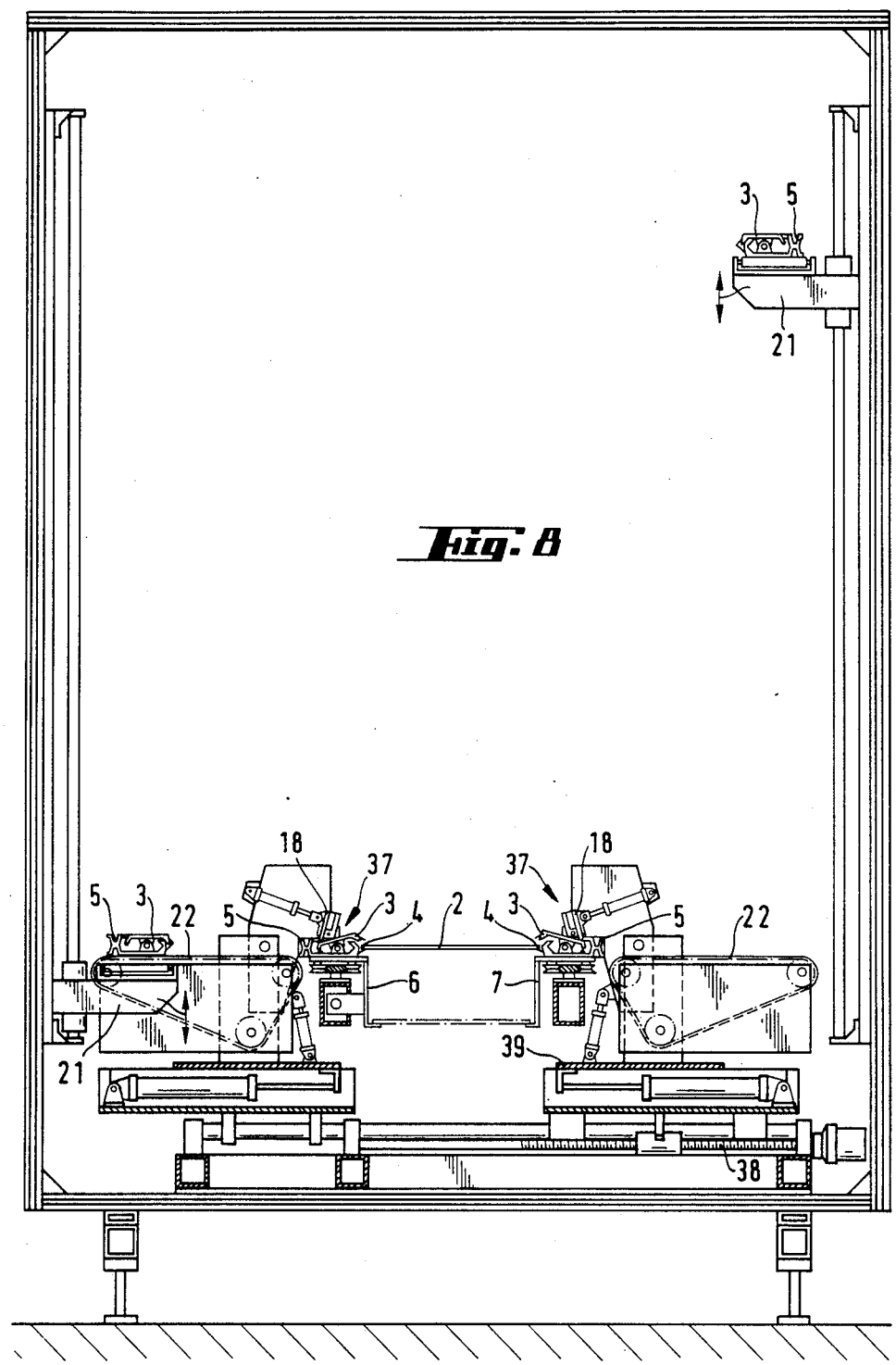
Figure 9:
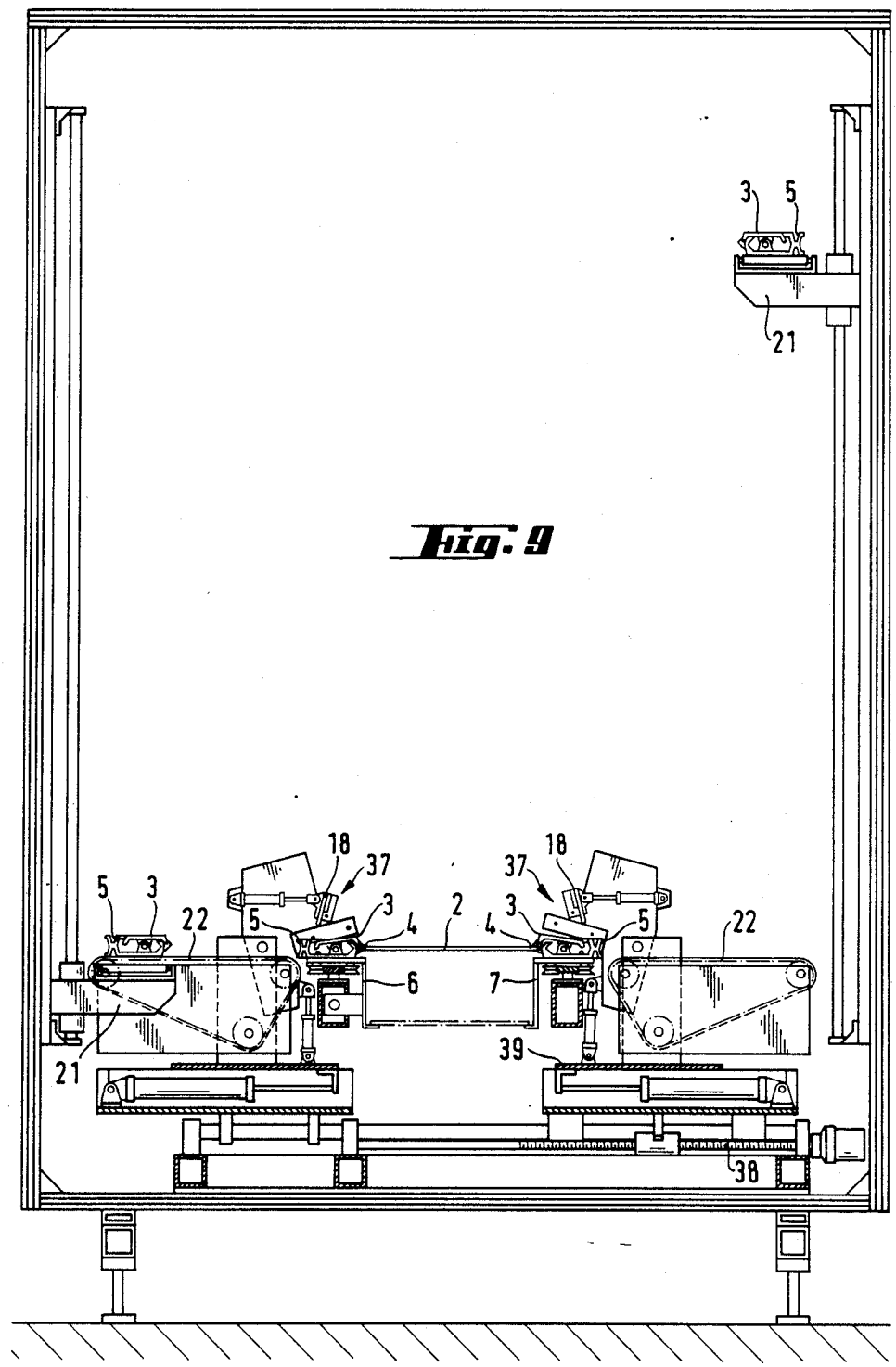
Figure 10:
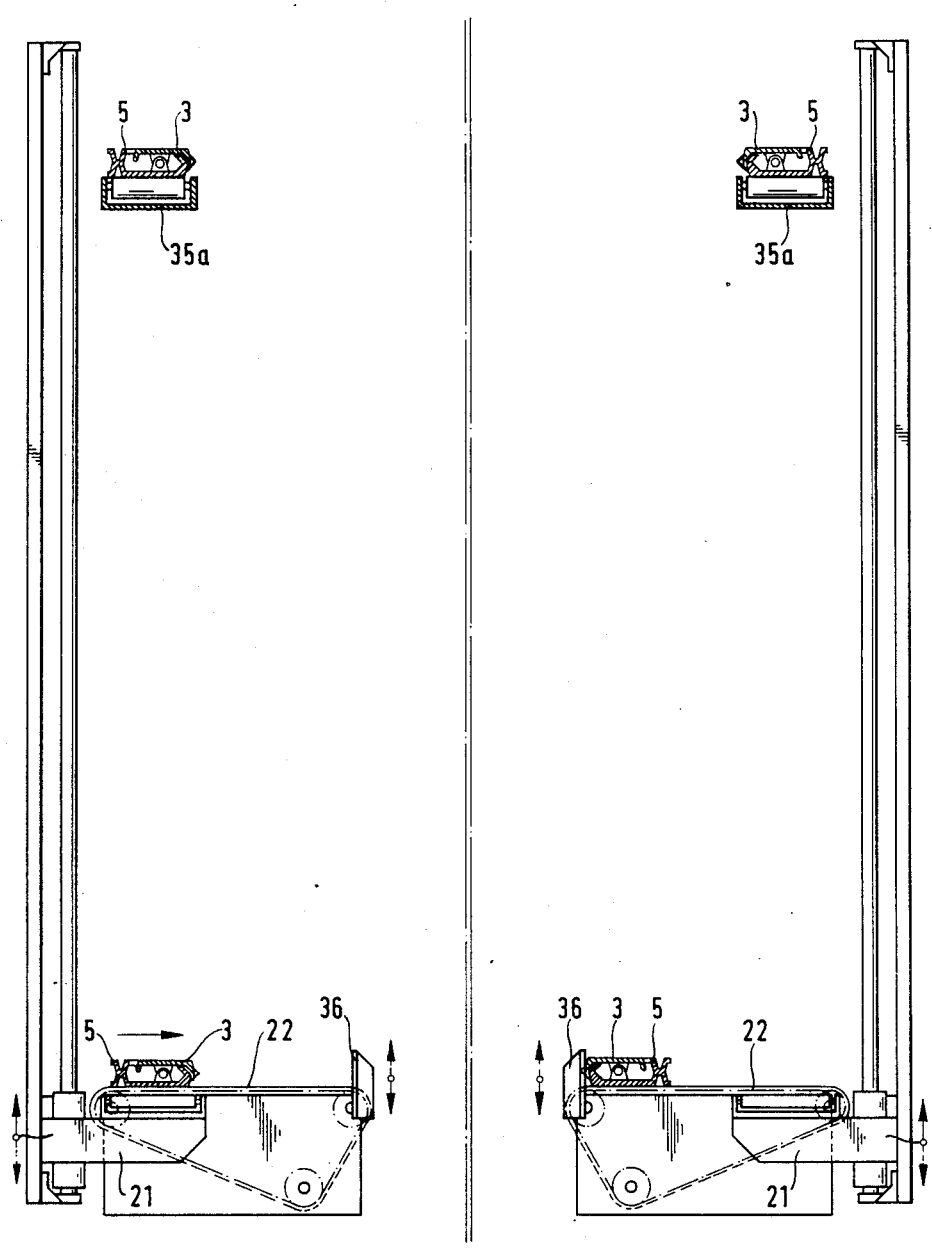
Figure 11:
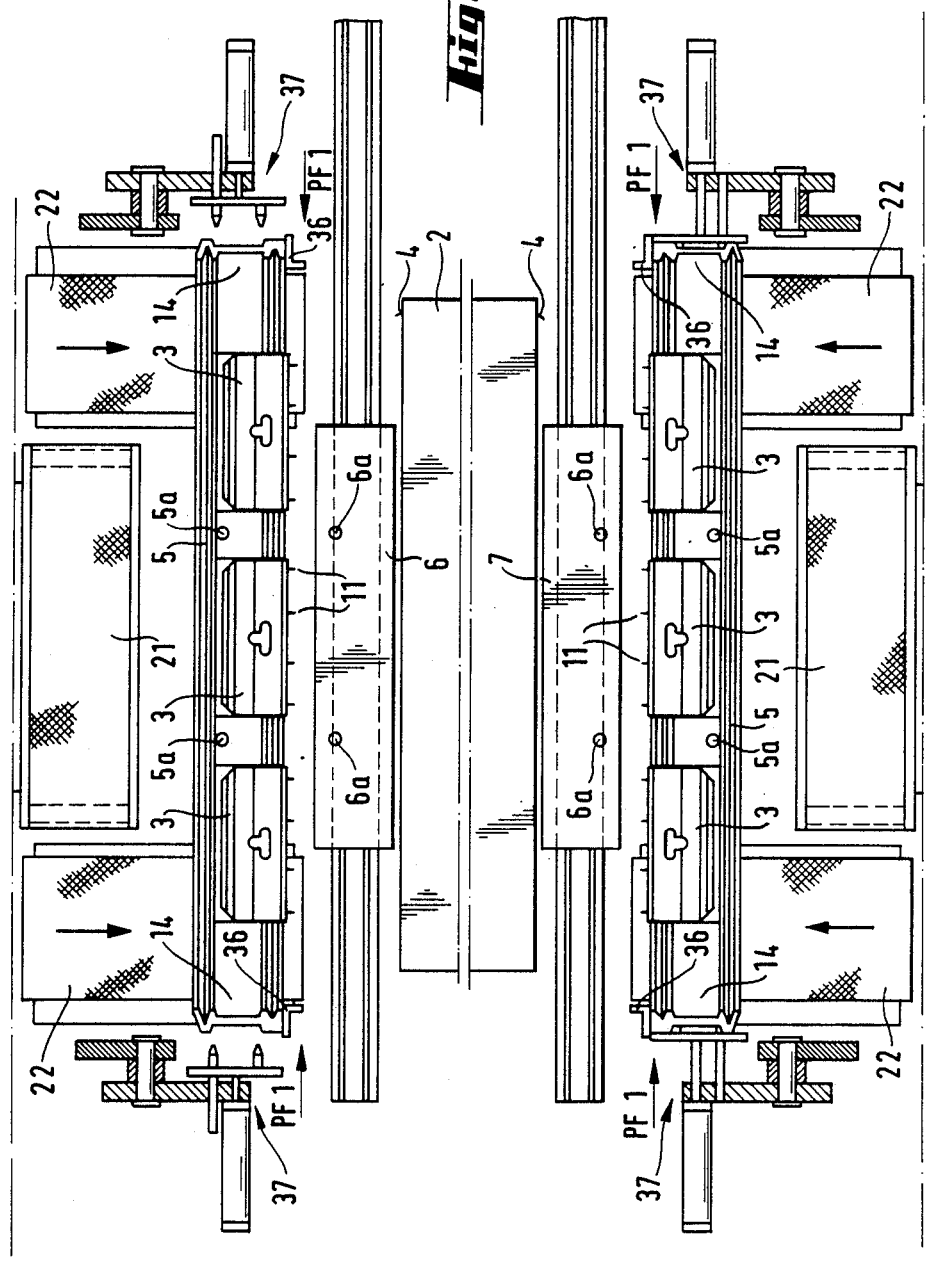
Figure 12:
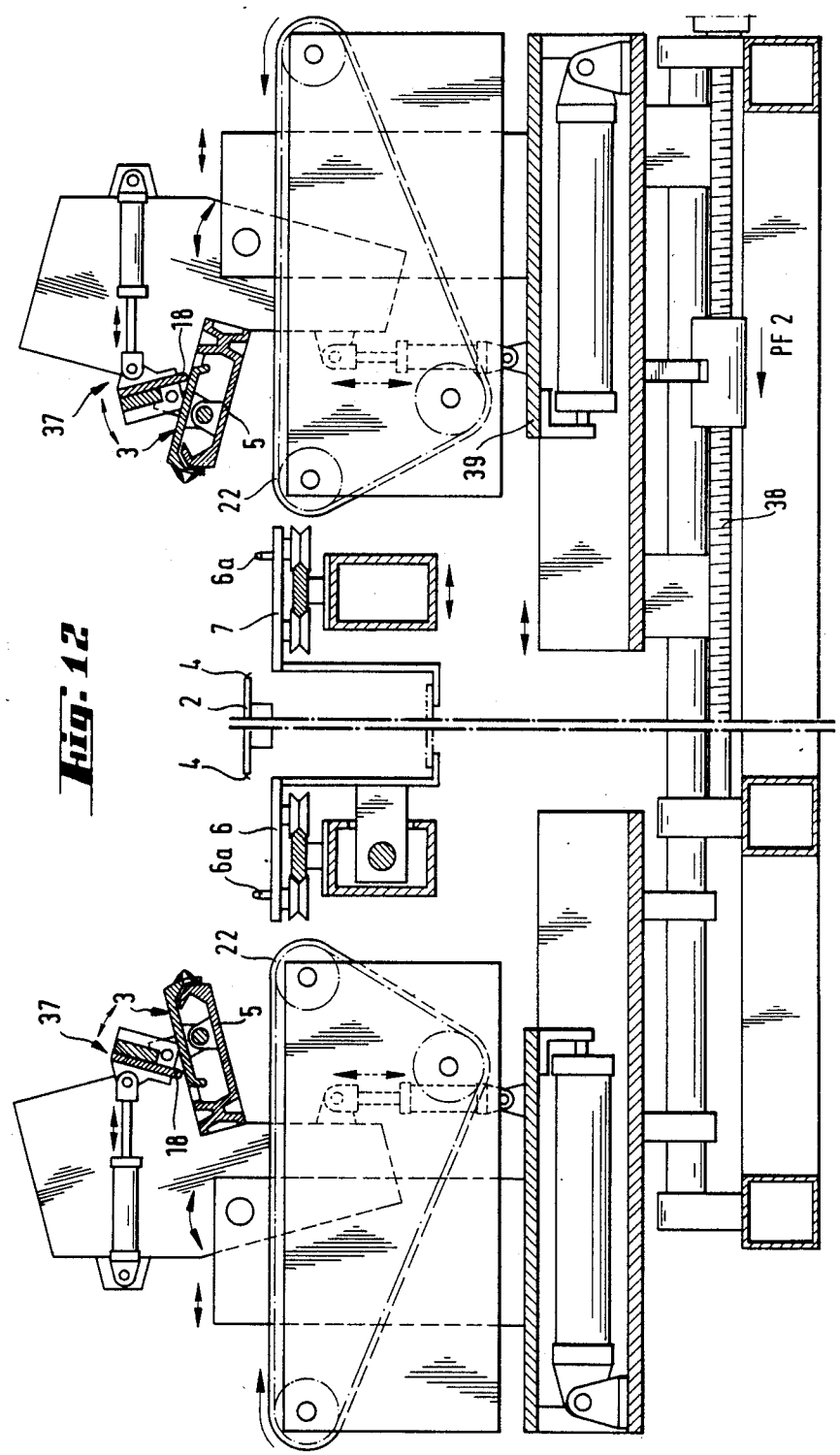
Figure 13:
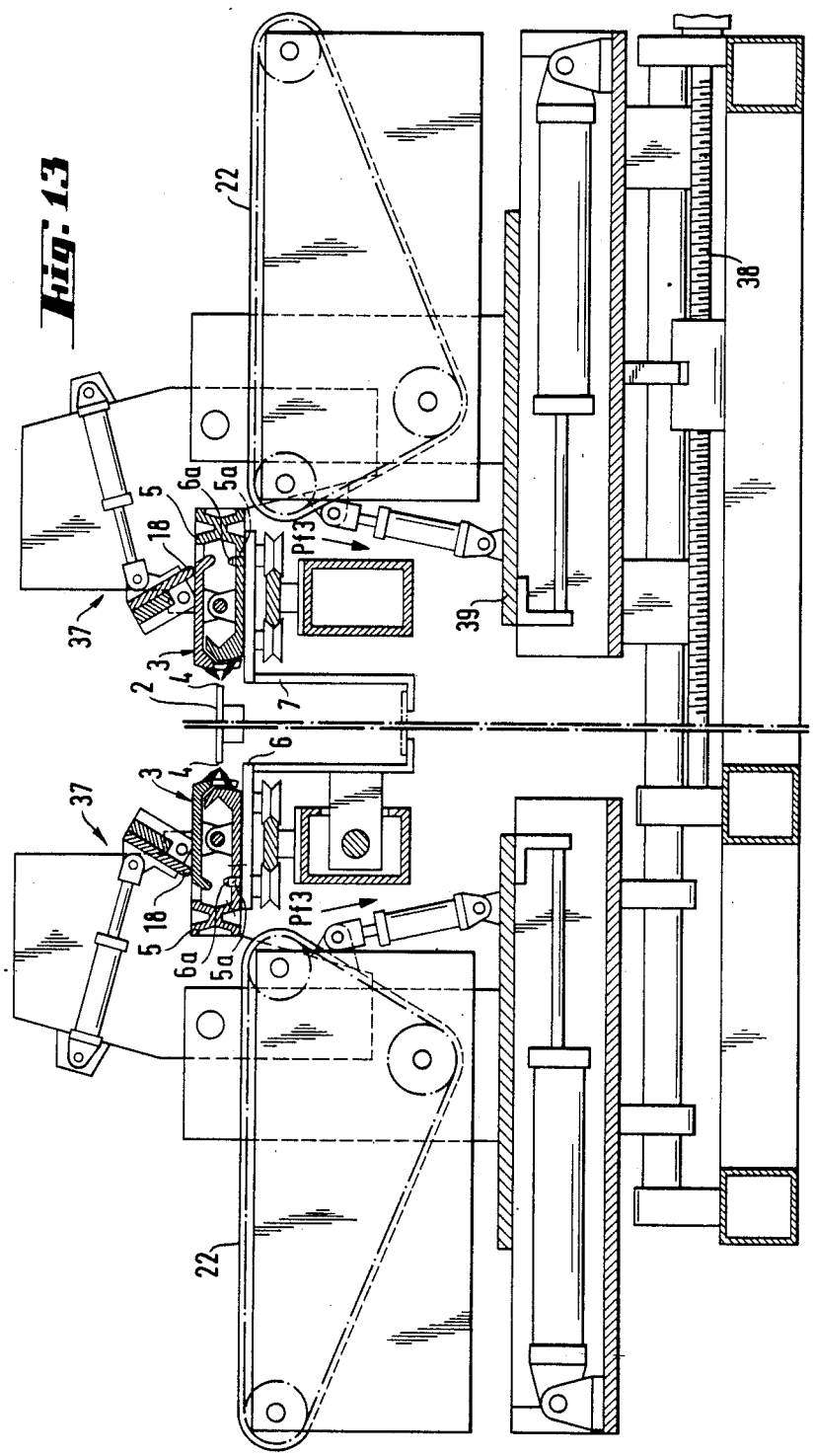
Figure 14:
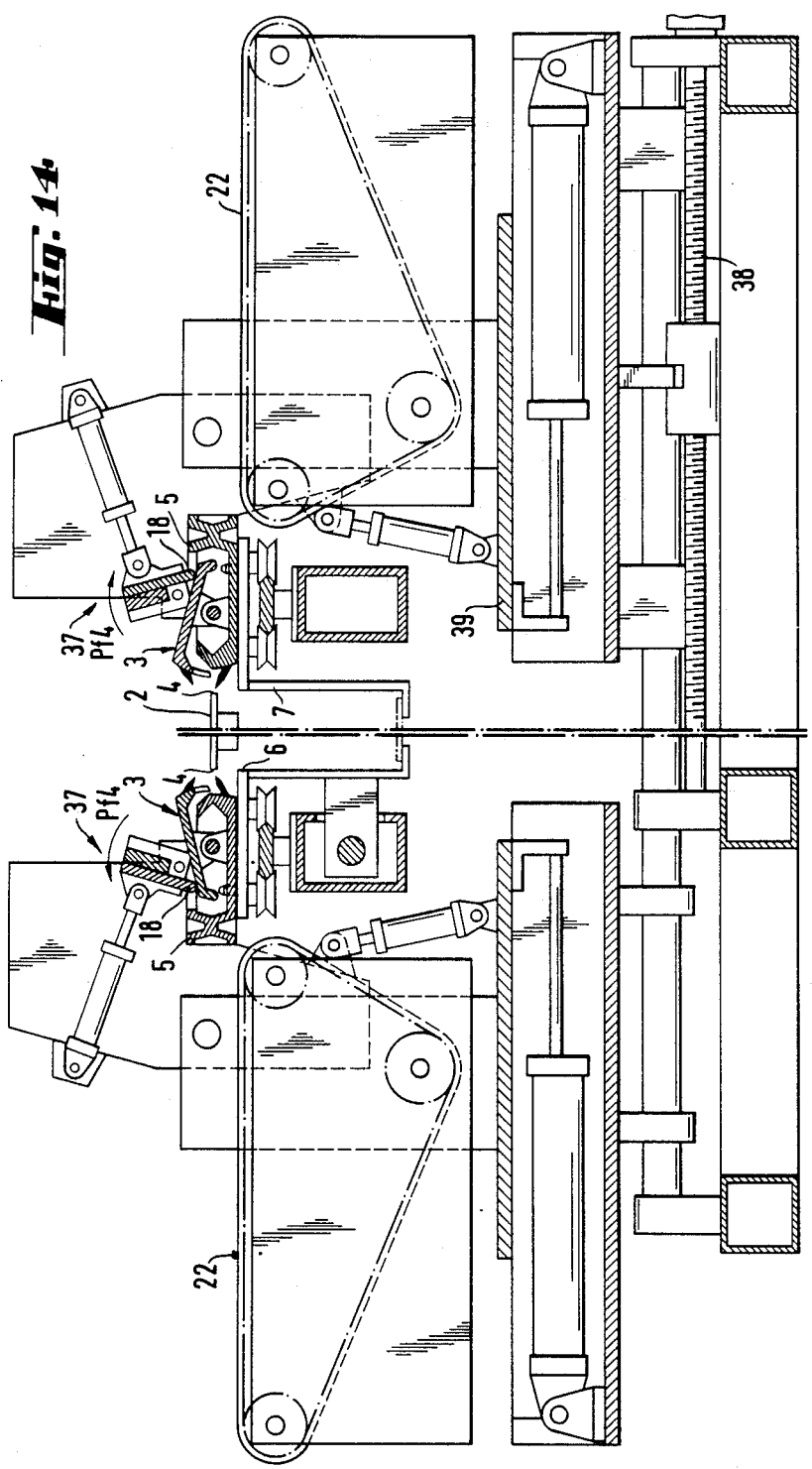
Figure 15:
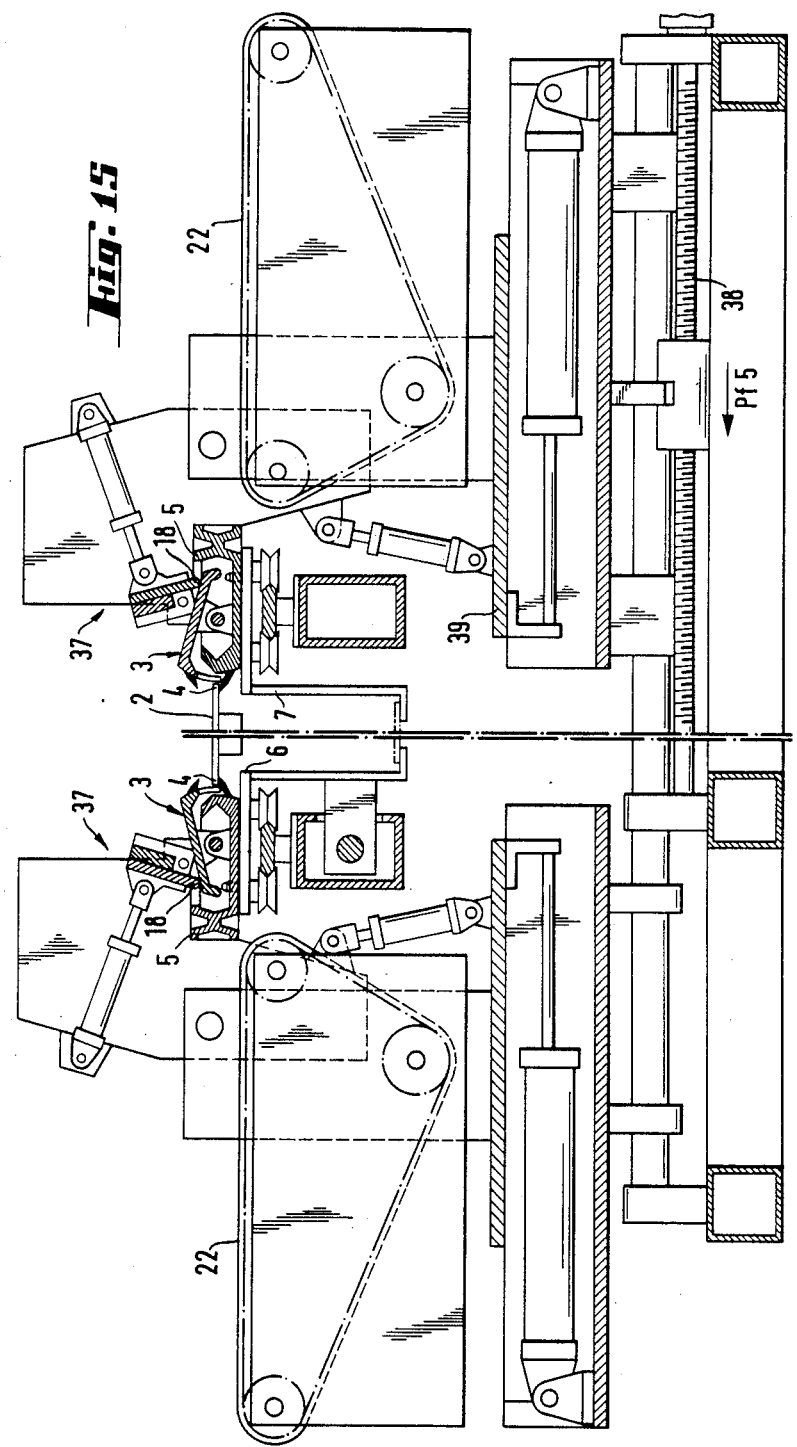
Figure 16:
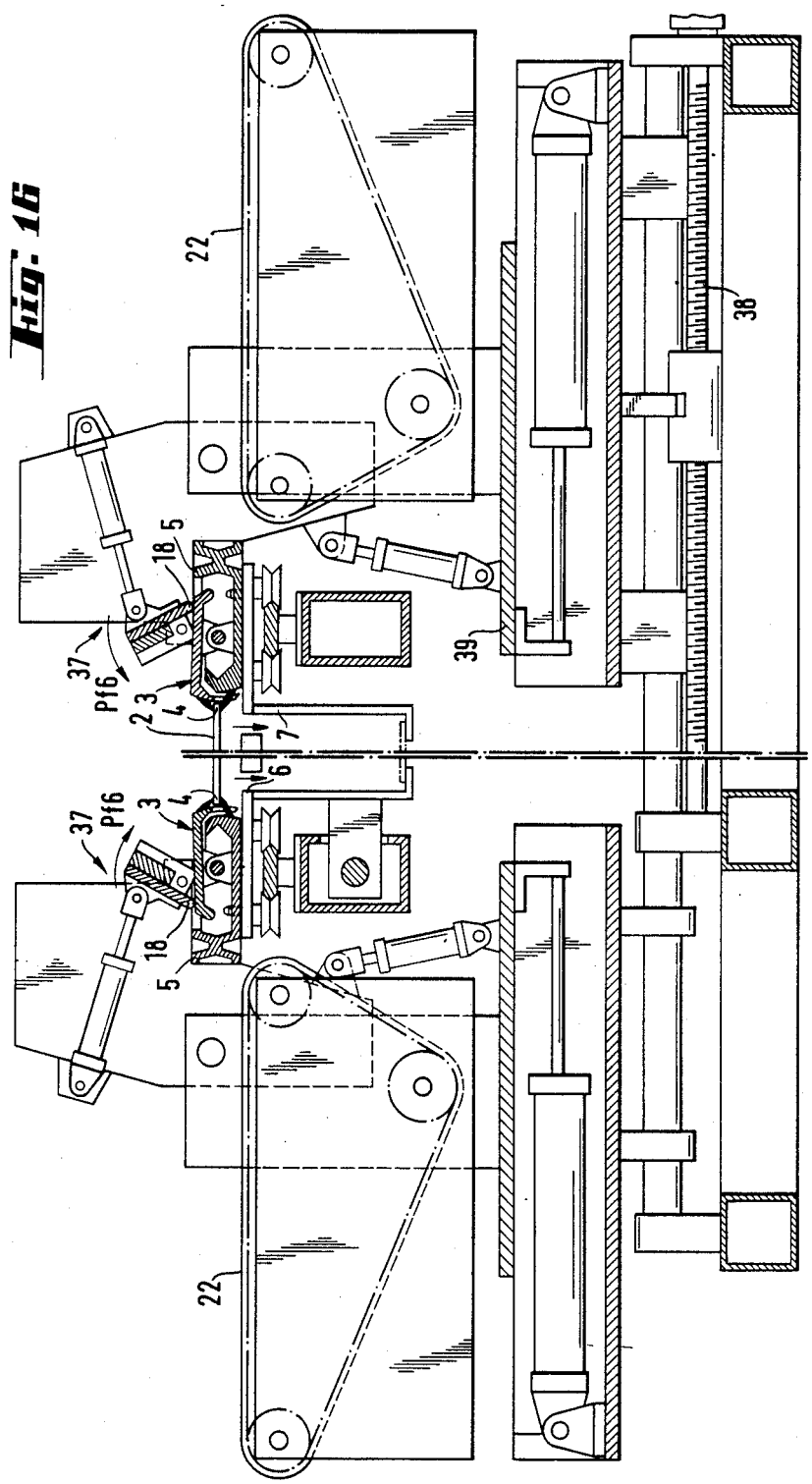
Figure 17:
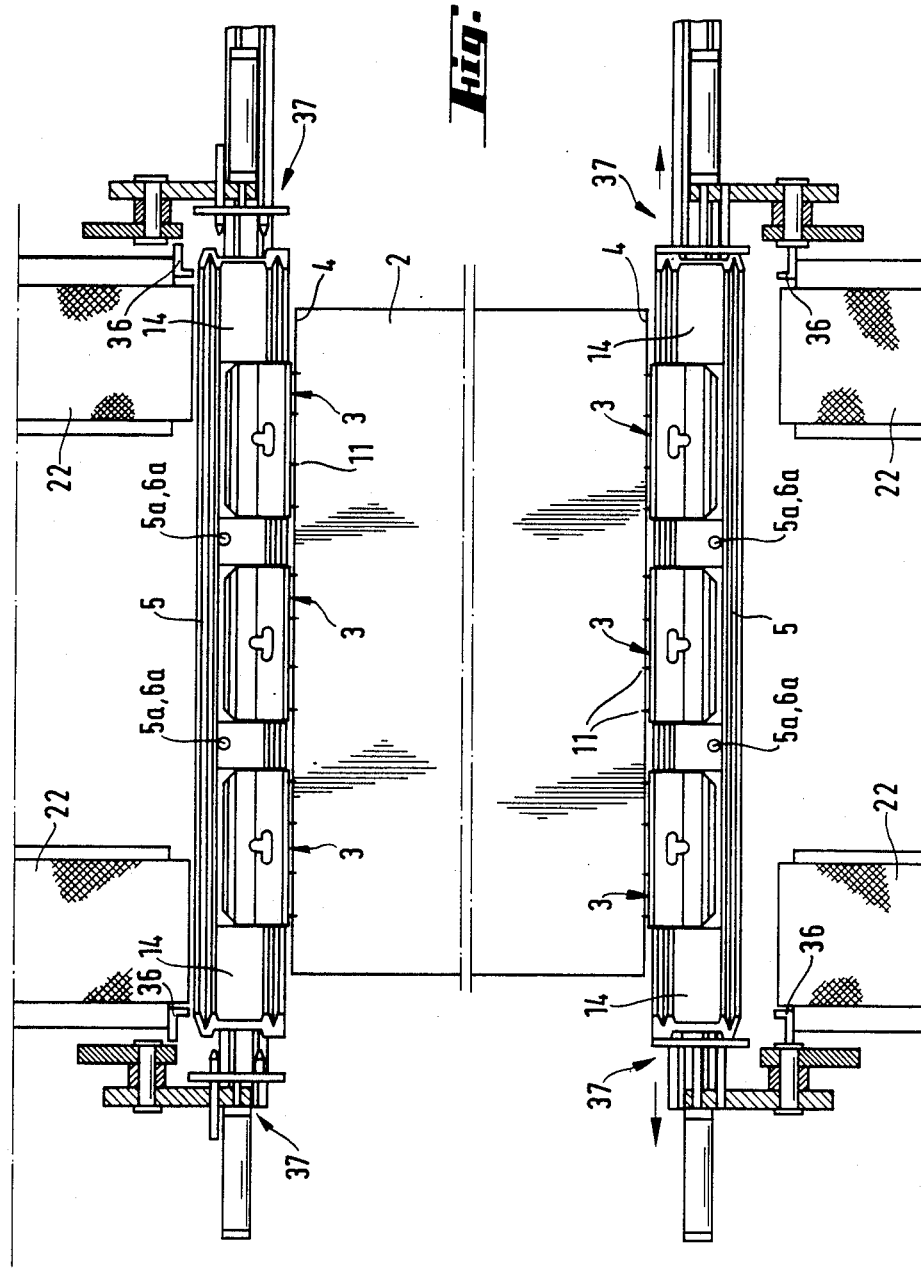
Figure 18:
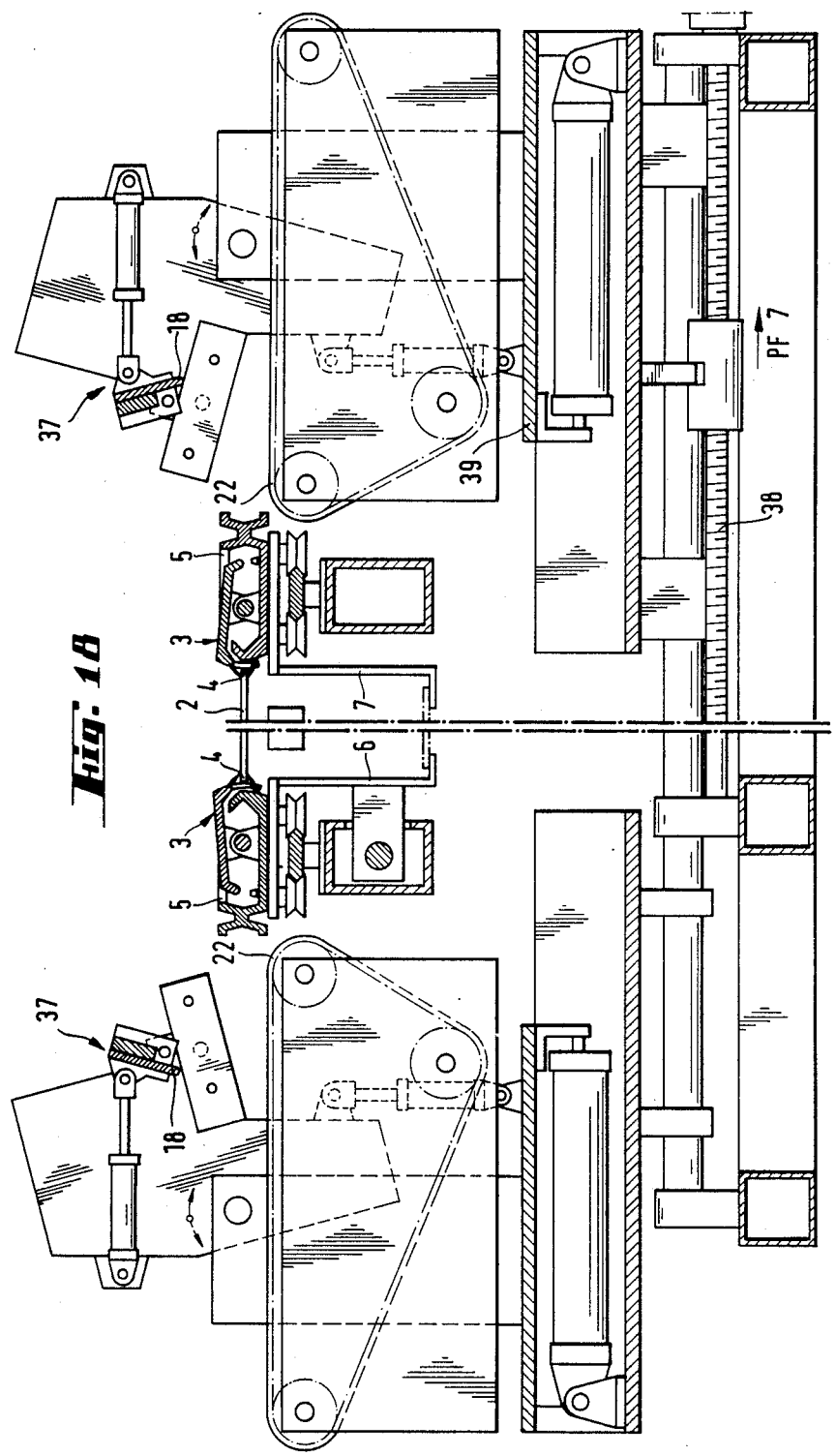
Figure 19:
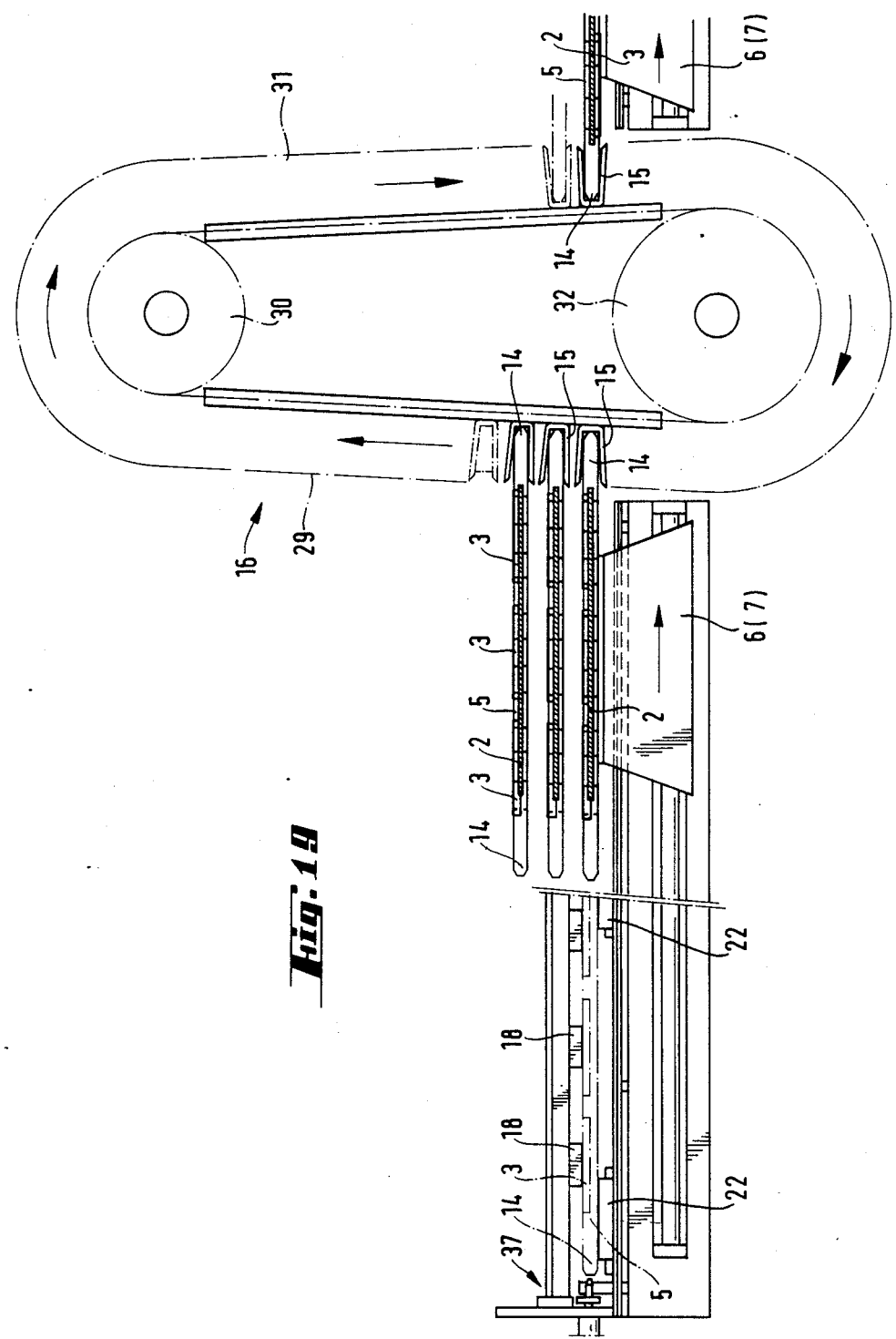

In order to enable the invention to be more readily understood, reference will now be made to the accompanying drawings, which illustrate diagrammatically and by way of example an embodiment thereof, and in which:

FIG. 1 is an overall view of a transport apparatus according to the invention,

FIG. 2 is a plan view of a holding element, which seizes a board in its edge region with grippers and remains connected to the board during the entire advancement by means of various conveying means in the transport apparatus, FIG. 3 is a cross-section through two holding elements seizing the longitudinal edges of a board with the aid of their grippers, FIG. 4 is a side view and FIG. 5 is a plan view of a first station of the transport apparatus, where the delivered printed circuit boards and their dimensions are detected electro-optically and/or mechanically and the circuit boards are aligned for width detection, FIG. 6 is a view of the apparatus for the alignment of the circuit boards for their width detection, viewed in the direction of advancement towards the end face of a circuit board running transversely to the longitudinal edges to be seized, FIG. 7 is a plan view of the width detection of the circuit board according to FIG. 6, FIG. 8 is a front view of the station of the transport apparatus, where the holding elements are connected to the aligned boards, the grippers being open, FIG. 9 is a view similar to FIG. 8 showing the station after the closing of the grippers and the seizing of the board edges, FIG. 10 is a view of the feed station for the holding elements similar to FIGS. 8 and 9, but only showing the functional sequence of the feeding of the holding elements, FIG. 11 is a plan view of the feeding station for the holding elements, a gripper head of a handling unit for a respective holding element seizing and centring the latter, FIG. 12 is a front view of a station for feeding the holding elements to the boards to be seized, the holding elements seized according to FIG. 11 being raised and moved towards each other as far as the previously detected width of the boards, FIG. 13 is a view similar to FIG. 12, but showing the holding elements are lowered and laid on their transport carriages, FIG. 14 is a view similar to FIG. 13, but showing the opening operation of the grippers of the holding elements against a restoring force, FIG. 15 is a view similar to FIG. 13, but showing the final setting of the distance between the two holding elements and at the same time the gripping underneath of the holding board to be seized by the lower fixed clamping jaw of the holding element, FIG. 16 is a view similar to FIG. 14, but showing the closing of the grippers of the holding elements and consequently the connection to the board edges, FIG. 17 is a view similar to FIG. 11, but showing the gripper heads being opened, after which the printed circuit board rests with its holding elements freely on the carriages, FIG. 18 is a view similar to FIG. 12 but showing the shifting of the gripper heads for the holding elements into their initial position, FIG. 19 is a side view showing the feed of the holding elements to an upwardly and downwardly leading conveyor, for example in a drying chamber, this upwardly and downwardly leading conveyor being moved on in each case step-by-step by the distance of one receptacle for a holding element, and FIG. 20 is a view, on an enlarged scale and partly in section, of the connection between a coupling end of a holding element and a receptacle on the upwardly and downwardly leading conveyor.

Referring now to FIG. 1, of the drawings, there is shown a transport apparatus, generally denoted by 1, for boards or workpieces 2 in board form, the boards concerned in this specific case being printed circuit boards 2, the surface of which is to be coated with a plastics which is curable by ultra-violet radiation. Each board is to be preheated before this coating, coated on both sides with a pre-drying operation between these two coating operations, and then subjected to a final drying operation after the coatings have been applied. The transport apparatus I thus leads over individual advancing means and conveyors, still to be described in each case, to various work stations, the workpiece, namely the board 2, having in some cases to change direction and also in some cases to change the advancing means.

Instead of the arrangement of various conveying means and processing stations according to FIG. 1, the transport apparatus 1 could, however, be adapted with changing advancing means also for other handling and processing operations of workpieces in board form and lead to other work stations in each particular case, in another sequence and combination.

What is important in each case is that the apparatus 1 has grippers 3 for seizing the board edges 4 during the transport and advancement of the boards 2 to and through the processing stations, so that the remaining board area remains free and cannot be damaged and impaired by contact with a variety of holding elements.

In order to be able to effect the transfer of the boards 2 during the change from one conveying means or advancing means to the other and to the work stations as far as possible without risks to the sensitive boards, an essential component of the apparatus 1 is a holding element 5 or rack which can be coupled releasably to the transporting or advancing means of the apparatus 1 and on which the gripper or grippers 3 or clamps for seizing the board edges 4 are provided.

This holding element 5 or rack which can be coupled releasably, in a way still to be described, to the transporting and advancing means, thus remains connected to the boards 2 during the entire transport and the entire processing of the same or—expressed the other way round—even during the change from one advancing means to the other, the gripper or grippers 3 on the board edges 4 need never be opened, so that all these transfer operations do not affect the board 2 itself. Instead, the holding element 5, connected to the board 2 during the complete transport of the latter, is transferred and reloaded together with this board 2 held by it in each case at transitions from one advancing means to another or from one work station to the other.

Thus in practice, the holding device for boards, previously provided on advancing means, is no longer integrated with these advancing means themselves but is detached from the latter and can be passed on from advancing means to advancing means.

This holding element 5 is shown in particular in FIGS. 2 and 3, separately and enlarged, while its handling and its interaction with the advancing means can be seen in further figures and is described with reference to these figures.

Firstly, it can be seen in FIG. 3 that two parallel holding elements 5 are provided in each case with at least one gripper 3, in this case, as shown in FIG. 2, with three grippers 3, for the two longitudinal edges 4, oriented in the direction of advancement, of a board 2, which grippers can be set during seizing of the board 2 over its entire width in a way still to be described and subsequently can be coupled to transporting and/or advancing means brought into corresponding positions.

At this point, it should be pointed out that an advancing means, namely a carriage 6 which is displaceable in the direction of advancement, for the holding element 5 of the one board edge 4 within the transport apparatus, has a path and orientation which is fixed and remains fixed relative to the apparatus and the second advancing means, namely a carriage 7, for the second holding element 5 can be moved in a lateral direction relative to the advancing means 6 and set in each case to accommodate the width of the board 2 to be processed.

The use of two parallel holding elements 5 according to FIG. 3 can thus be applied not only to the dimensions of one board 2, but to any board widths if the measure described above of lateral adjustability of at least one advancing means is fulfilled. It is in this case a feature of this measure that in practice two mutually independent, but synchronously driveable parallel advancing means are provided, which allow the adjustment mentioned of their mutual spacing. The advancing means are thus adapted to allow the holding elements 5 for the two board edges 4 to be separate and independent of each other, while with conventional advancing means their width is generally fixed and an adaptation to workpieces of different widths is very complex.

The clamp or the gripper 3 on the holding element 5 has two jaws 9 and 10 which can move relative to each other and can spread apart from each other against the restoring force of a spring 8. In this arrangement, the lower jaw 10 in FIG. 3 is connected immovably to the housing 10a of the holding element 5, while the other jaw 9, at the top in FIG. 3, can be pivoted open and closed, as will emerge below with reference to FIGS. 13 to 16. The jaws 9 and 10 of the gripper or grippers 3 of the holding element 4 have, for seizing an edge 4 of a board 2, in each case at least two, according to FIG. 2 even four, preferably pointed, projections 11, which are arranged with a spacing alongside each other in the longitudinal direction of the board edge 4 and are directed against the board surfaces, corresponding projections 11 of the two jaws 9 and 10 in each case lying approximately opposite each other with their tips 12, as shown in FIG. 3, in order to be able to introduce the clamping forces at one and the same point. These pointed projections 11 thus only take up very little room on the surface of the board and can, as shown in FIG. 2, engage very close to the longitudinal edge 4, thus hardly affecting the board surface at all. This applies in particular to printed circuit boards, which always have a certain outer free edge which is not to be coated. The projections 11 in this case sit as pins in holes 11a. In FIG. 3, it can be seen that the counter-jaw 9, which can be pivoted up with respect to the fixed jaw 10, has a rounded end face 9a, the radius of curvature of which corresponds to the pivoting radius of this end face about the pivot axis 9b of this clamping jaw 9. This curved end face 9a here overlaps an analogously curved end face 13 of the fixed jaw 10. At the same time, the end face 9a also protrudes between the projections 11, so that, with the clamping jaw 9, in the open position, the end face 9a can form a side stop for the circuit board 2, which stop does not change during the closing of the jaw even with respect to its lateral projection, due to the curved surface.

As already mentioned, a plurality of grippers 3, for example three, but possibly also only two, but on the other hand also four or five, may be arranged on a holding element 5 one behind the other in the direction of advancement and in the direction of the longitudinal extent of the holding element 5, which grippers together can, as shown in FIG. 2, engage a large board 2 or, if appropriate, in each case engage small individual boards. As a result, distortions or similar unevennesses which may exist in the case of large boards may be compensated and the desired holding force is applied with certainty along the entire longitudinal edge.

In FIG. 2, but in particular in FIGS. 19 and 20, it can be seen that the holding element 5 projects beyond the region of the gripper or grippers 3 which are on it in the direction of its longitudinal extent by a coupling end 14 which can be pushed or inserted into a pocket-shaped receptacle 15 of an upwardly and downwardly leading transporting means 16. It becomes clear here in the said figures that in fact both ends of the holding element 5 project as coupling ends 14 beyond the region fitted with grippers 3. Consequently, the transfer of this holding element 5 with a board 2 seized by it from a horizonatally acting advancing element into an upwardly and downwardly leading transporting means 16 is possible very simply, as still to be described with reference to the said figures.

One possibility can be seen from FIG. 3 as to how the movable clamping jaw 9 is, for the best and most automatic possible actuation, mounted like a rocker and on the pivot axis 9b extending in the longitudinal direction of the holding element 5 and has an overhang 17 opposite the jaw part with the projections 11 provided as an actuating region for interaction with an actuating element 18, acting on it from above, for pivoting the jaw 9 against the restoring force of the spring 8. A notch 17a can be seen on the surface of the overhang 17, which notch ensures the secure contact of the actuating element 18 from above even if a certain pivoting movement has been carried out.

According to FIGS. 8 to 10, the holding elements 5 with the grippers 3 are supplied by lifts 21, which can also be seen in FIG. 1, arranged in the feed region 19 (FIG. 1) of the boards 2 into the apparatus 1 to the side of a feed track 20 (FIGS. 4 to 7) directed in the direction of advancement of the boards 2. Underneath the lifts 21 there are arranged transversely to the direction of advancement of the boards 2, conveying means, which as shown in FIG. 10, are conveyor belts 22 which can be moved step by step, an individual holding element 5 being fed in each case from the side to the advancing means 6 and 7. This also serves the purpose of being able to seize the lateral board edges well and thereby being able to take into account boards 2 of different dimensions.

In the region of the feed track 20, according to FIGS. 4 to 7 a roller path, there are provided sensing each individual board 2 going into the apparatus 1, sensors, for example optoelectronic sensors, light barriers or the like, which are triggered by the dimensions of the said board and drive the drive for the feeding of the holding elements 5, that is for the conveyor belts 22, preferably designed as toothed belts, and the drive for the actuating devices 18 for the opening of the grippers 3. Beforehand, however, use is made of a screen 23 and a lowerable stop 24 for the advance detection and alignment of the individual circuit board 2, as can be seen in FIGS. 4 and 5. The screen 23, provided for lateral alignment, and its drive with the aid of a spindle 25 and a drive motor 26 can be seen in particular in FIG. 6. Light barriers 27 for the sensing of other board edges are also shown.

It has already been mentioned that carriages 6 and 7 are provided as advancing means for the holding elements 5, on which carriages the holding elements 5 can be releasably coupled in a way still to be described. At the same time, the carriage 7 for one longitudinal edge 4 of the board 2 is adjustable together with its advancing drive, likewise as already mentioned, transversely to the direction of advancement. The adjusting drive serving this purpose, not shown in any more detail, is then in turn driven by one or more of the optoelectronic sensors and stops in order to allow the adaptation to different board sizes fully automatically.

The lower side of the holding element 5, of flat and even design in the exemplary embodiment according to FIGS. 3 and 20, fits onto a correspondingly designed upper side of the advancing carriage 6 or 7 and these mutually contacting surfaces have coupling means for effecting a releasable coupling between carriage and holding element. In a way not shown in more detail for reasons of better clarity, in this case perforations in the one part and projections, pins or the like fitting the latter in the other part may be provided as particularly simple coupling means. In order that the holding element 5, which should be capable of being transferred from one advancing means to another and moved and handled in different ways, with as little trouble as possible, it is advantageous if the coupling perforation or plurality of coupling perforations 5a (FIGS. 11 and 17) are arranged on the holding element 5 and the coupling pin or pins or projections 6a (FIG. 12) are arranged on the upper side of the advancing carriages 6 and 7. The coupling projection in this case expediently fits as an index bolt with a fit into the coupling opening and has, preferably, a tapering free end for centering during introduction into the coupling opening. As a result, the positioning of the holding element 5 in a precise on the carriage 6 or 7 is also achieved at the same time during coupling.

It can be seen from FIGS. 19 and 20 that the coupling end 14, respectively pointing in the direction of advancement, of the holding element 5 projects beyond the carriage 6 and 7 in the direction of advancement as a plug coupling for the releasable connection to the upwardly and downwardly directed conveyor 16 within a preheating chamber 28. This has the effect that the carriages 6 and 7 introduce the holding elements 5 or racks during their advancement straight into the pocket-shaped receptacles 15, already described, of this transporting means 16. After the transfer of the holding elements 5 to the upward and downward conveyor 16 and its receptacles 15, the carriages 6 and 7, which are oriented parallel to each other and can move together synchronously with each other in the direction of advancement, can again be returned to their initial position, so that they can accept and again bring forward the next pair of holding elements 5 with one or more boards.

Such an upward and downard conveyor 16 is not only present in the preheating chamber 28, already mentioned, but according to FIG. 1 also at three other points, that is in the exemplary embodiment a total of four times within the complete apparatus 1. The features in this respect, described below, apply in this case to all these conveyors It can be seen in FIGS. 19 and 20 that this conveyor 16, accepting the holding elements 5 with the board or boards 2 from the horizontally led carriages 6 and 7, has an upwardly leading run 29 and a run 31 leading downwards again over a return roller 30 and that the pocket-shaped or U-shaped receptacles 15 carried by these runs are arranged at regular intervals one above the other or alongside one another, into which receptacles the coupling ends 14 of the holding elements 5 fit and, according to FIG. 20, can be inserted so deep that, in the upward movement, the pivoting movement in the region of the upper return 30 and the subsequent downward movement, the two parallel holding elements 5 projecting out of the receptacles 5 with the gripping regions or the board or boards 2 are seated firmly by the frictional force alone. Special clamps to open and to close and similar mechanically couple parts are thus avoided on the conveyor 16 in an advantageous way, so that the transition of the holding elements 5 from the horizontally moved carriages 6 to the upwardly leading run 29 also takes place very simply and quickly, the insertion movement being facilitated by a conical design of the outer coupling end 14.

The U-shaped receptacle 15 for that holding element 5 which is moved forwards on a fixed advancing track, not adjustable in transverse direction, has side walls 15a approximately perpendicular to the U-legs 15b of this U-shaped receptacle, the clear span of which corresponds approximately to the width of the coupling projection 14 of the holding element 5, so that the receptacle 15 of the upward and downward conveyor 16 is designed in this region as a coupling pocket enclosing the coupling end 14 of the holding element 5 on all sides.

Starting from this coupling pocket, closed at the sides, the receptacles 15 are designed U-shaped and with constant cross-section over their entire lateral extent, so that the second holding element 5 is clasped on its upper side and lower side at any desired distance from the holding element 5 engaging in the pocket. Consequently, allowance is also made at these receptacles 15 of the conveyor 16 for the fact that two holding elements 5 are provided parallel to each other, one of which is always brought forward on a same, fixed conveyor track, while the other, due to different dimensions of the boards, can come to rest against it at different parallel distances. Consequently, the receptacles 15 are not only adapted with respect to their cross-section to the coupling ends 14 of the holding elements 5, but also to the fact that here in each case two holding elements 5 can bring forward boards 2 of different widths and are to remain connected to the boards during unloading onto the conveyor 16.

It can be seen in FIG. 19 that the upwardly leading run and the downwardly leading run 31 of the conveyor 16 are in each case inclined at an acute angle to the vertical in such a way that the two runs have a smaller distance from each other in the upper region of the conveyor 16 than in the lower region. This is achieved by the upper return roller or roll 30 of the conveyor 16 having a smaller diameter than the lower return 32 and the two runs being arranged symmetrical to a vertical plane through the axes of the two returns 30 and 32.

In this arrangement, the angle at which the runs 29 and 31 are arranged to the vertical corresponds approximately to the pivoting angle by which the holding elements 5 are pivoted under the action of gravity and taking into account the coupling play in their one-sided restraining region with respect to the upwardly leading run 29 and the downwardly leading run 31, respectively, in order to stand up approximately horizontally in each case on the conveyor 16, so that a fresh lacquer layer or the like cannot partially run off. Thus, instead of striving for very accurate fits and tolerances or providing complex clamps and supports in order to hold the holding elements 5 precisely horizontal in each case on the conveyor 16 in order that fresh lacquer or plastic cannot run, instead of this, relatively large plugging tolerances are used, which also facilitate the transferring of the holding elements 5 from one conveying means to the other, but in an unusual way provide an inclination of the two runs to compensate for this play. To this measure is attributed quite particular significance, because, due to this initially upward and then again downward transporting conveyor 16, part of the transport line of the transport apparatus 1 runs more or less vertically to the predominantly forward movement, as a result of which the spatial extent of the complete apparatus 1 can be kept small at the same time as having an adequately long overall transport line. Thus, for example, a predrying can be carried out during this upward and downward conveyance, later a first drying of a fresh lacquer layer and finally an adequately long drying, with continuous onward movement of the holding elements 5 with the boards 2 seized by them.

At the lower end region of the downwardly leading run 31 of the conveyor 16, again a horizontal guide track with carriages 6 and 7 or the like is provided for the acceptance of the holding elements 5 with boards 2, which guide track leads, according to FIG. 1, to a first application device 33 for protective or solder-resist lacquer or plastics, at which the upwardly facing side of the respective board 2 is coated with this lacquer or plastic.

In a way not shown in more detail, there may be provided in this application device 33 a lacquer limiter, which is driven by optoelectronic sensors, if appropriate those at the inlet 19 into the apparatus 1, and prevents the application of lacquer onto the holding elements 5 and the grippers 3 which are on them.

According to FIG. 1, the horizontal guide track leads through this application device 33 into a drying chamber 34, in which—as already indicated—an upward and down ward conveyor 16, corresponding to that in the preheating chamber 28, is arranged, the advancing speed and the height of this conveyor 16 being chosen such that the lacquer or plastics layer which is on the surface of the boards 2 can be dried during the upward transport to such an extent that it no longer runs when turned over and conveyed downwards.

In the lower transfer region of the downwardly leading run 31 of the conveyor 16 of the drying chamber 34 there adjoins further horizontal guide track with carriages 6 and 7 and the downwardly conveyed holding elements 5 can be coupled there to the carriages 6 and 7 and can be conveyed into a further application device 33, which expediently corresponds to the first application device 33 and can then coat the side of the board turned from bottom to top in the conveyor 16 of the first drying chamber 34 in an advantageous way. In this arrangement, this conveyor 16, which conveys up and down and thus requires little space, proves to be additionally advantageous to the extent that it can at the same time serve for the turning of the boards 2, this turning of the boards again taking place via the holding elements 5.

The second application device 33 is adjoined by at least one further drying chamber 34 with two upward and downward conveyors 16 and, behind this, a delivery track 35 is then arranged. In the exemplary embodiment, the boards are consequently turned a total of four times from the inlet 19 to this delivery track 35, that is they have their initial position again, but have now been coated and dried and undergone various handling operations in the process, without once having to leave the holding elements 5 seizing them. Instead of this, these holding elements 5, which are insensitive to such reloading operations, have been moved, transferred, turned and advanced. Consequently, coated boards of highest surface quality can be produced, there being in an advantageous way virtually no rejects any longer.

On the delivery track 35, actuating devices 18 for opening the grippers 3 analogous to those on the entry track and transverse conveyor for the seizing and lateral carrying away of the holding elements 5 may be provided. In addition, on the sides of the delivery region, conveying means 35a for seizing and returning the holding elements to the lifts 21 may then be arranged at the entry 19 into the apparatus 1.

These actuating devices 18, located both in the starting region and in the end region of the transport apparatus 1, and their functional sequence are shown step by step in FIGS. 8 to 18 and proceed as follows:

Once a circuit board 2 has been positioned and broadly detected with respect to width on the circuit-board advance detection according to FIGS. 4 to 7, the racks or holding elements 5 come from the lift 21 and are deposited on the toothed-belt conveyor 22, and are conveyed from there against a stop 36 (FIG. 10).

A gripper head 37, which can be seen in particular in FIG. 11 and is, according to the upper representation in FIG. 11, initially open, is then closed according to the arrows Pf 1 and seizes and centers the holding elements 5. According to FIG. 12, this gripper head 37 then raises the holding elements 5 and moves together according to the arrow Pf 2 in FIG. 12 as far as the width detected in advance of the respective board 2.

The gripper head 37 is then lowered, according to FIG. 13, in the direction of the arrows Pf 3, and lays the holding elements 5 onto the carriages 6 and 7.

By a corresponding downward movement of the actuating devices 18 which are on the gripper heads 37, according to the curved arrows Pf 4 in FIG. 14, the rocker-like pivotal upper clamping- jaws 9 of the grippers 3 of the holding elements 5 are then opened.

Then, according to FIG. 15, the transverse carriage 39 carrying the one gripper head 37 is further advanced by means of a spindle drive 38 in the direction of the arrow Pf 5, until the distance between the two holding elements 5 and their grippers 3 corresponds to the final circuit board width.

Then, according to FIG. 16, the actuating elements 18 are again raised from the grippers 3, corresponding to the arrows Pf 6, so that the grippers close due to the springs 8 and thus clamp the longitudinal edges of the board 2.

According to FIG. 17, the gripper heads 37 are then opened and, according to FIG. 18, raised and pushed back out of the region of the holding elements 5, corresponding to the arrows Pf 7.

Thereafter, according to FIG. 19, with the aid of the carriages 6 and 7, the pair of holding elements 5 seizing a circuit board 2 can be transported to the conveyor 16, the latter transporting upwards the holding elements seized in each case, in time with the holding elements 5 arriving. This rhythmic transport of the holding elements 5 and of the circuit boards 2 within this pater noster-like conveyor 16 is maintained until transfer onto the adjoining horizontal conveyor which, as already described, leads to a first application device 33 for the protective lacquer or plastics.

The conveyor 16 behind this application device 33 also rhythmically takes the circuit board up, while it is subjected to a heat treatment, turns it and brings it to the next horizontal conveyor, which leads through the second application device or casting machine and coats the side of the board then turned upwards. In the adjoining paternoster, the circuit boards are again transported rhythmically and subjected to a heat treatment.

The handling units which are behind the drying chambers operate during the opening of the holding elements, their moving apart and the removal of the finished board 2 in the reverse sequence, as has been explained above with reference to FIGS. 8 to 18.

The holding elements 5 which are again free and at the end can be transported back immediately in order to be used for the acceptance of further boards 2. The overall result is consequently a transport apparatus 1 with which circuit boards can be seized and coated in a confined space without there being a risk for the sensitive surface of these boards, since the holding elements 5 for these boards 2 remain constantly connected to the boards, even when the respective advancing means and the direction of advancement are changed within the transport apparatus 1.

This principle of making the holding element for the respective board independent of the conveying means and capable of being reloaded, and of providing for this purpose corresponding coupling projections and coupling means on the holding element and the conveying means, can of course also be applied in the case of other apparatus for the handling and processing of workpieces in board form.

The handling of the boards 2 is thus in practice directed instead to its holding elements 5 and consequently the risk which this handling entails is kept away from the boards 2.

What is claimed is:

1. A transport apparatus for conveying workpieces in the form of boards comprising advancing means for advancing the workpieces holding elements for the workpieces, gripping means incorporated in each holding element and adapted to grip a workpiece and hold it relative to the holding element, and means releasably coupling a holding element to the advancing means, the advancing means serving to advance the workpiece while engaging only the holding element which holds the workpiece by means of its gripping means, whereby the workpiece can be advanced without coming into direct contact with the advancing means, two holding elements, each incorporating at last one gripper and disposed for engaging opposite longitudinal edges of said workpiece, a first of said advancing means and a second set of the advancing means, the first set following a fixed path and the second set of advancing means being movable laterally relative to the first, whereby the system can accommodate workpieces of different widths.

2. The transport system of claim 1, wherein each holding element is formed at at least one end there of as a coupling region for coupling the holding element to said advancing means.

3. The transport system of claim 7, wherein each gripping means is in the form of at least one gripper, each gripper having two jaws, a first one of which is immovably connected to the holding element and a second one of which is pivotable against the action of a restoring force relative to the first.

4. The transport system of claim 3, wherein said second jaw is pivoted intermediate its ends, the part of the jaw on the other side of the pivot axis from the gripping portion serving as an actuation region for engagement by an actuating element.

5. The transport system of claim 3, wherein each jaw comprises two projections spaced apart in the longitudinal direction of a workpiece for engaging the surface of a workpiece, the projections of one jaw lying opposite those of the other.

6. The transport system of claim 5, wherein said second jaw has a rounded end face, the center of curvature of which is the axis about which the jaw is pivotable, said end face overlapping an analogously curved end face of the first jaw and protruding between said projections.

7. Apparatus for conveying workpieces in the form of boards, comprising holding elements for the workpieces, at least one first jaw fixedly incorporated in each holding element, at least one second jaw pivotally incorporated in each holding element, a first jaw and a corresponding second jaw being arranged to engage on opposite surfaces of a workpiece and holding elements being provided for each longitudinal side of a workpiece, a first set of advancing means, a second set of advancing means, means releasably coupling holding elements to each of said sets of advancing means, means for feeding workpieces to a holding compartment, lift means at said holding compartment for supplying holding elements to a level for engagement with said advancing means, conveyor means for moving holding elements at said level in a direction transverse to the direction of travel of the workpieces to engage said holding elements with said advancing means, whereby holding elements are provided to engage each side of a workpiece, and actuating means to open said jaws and cause said holding means to engage each side of a workpiece.

8. The apparatus of claim 7, wherein said coupling means comprises projections and perforations provided one in the base of the holding element and the other in the upper surface of the advancing means.

9. The apparatus of claim 7, and further comprising sensors at said holding compartment for sensing the dimensions of a workpiece and for operating said conveyor means and said actuating means.

10. The apparatus of claim 9, wherein the first and second sets of advancing means are carriages.

11. The apparatus of claim 9, wherein said sensors are optoelectronic sensors.

12. The apparatus of claim 11, and further comprising means for moving one of said carriages transverse to the direction of travel of a workpiece, thereby to accommodate workpieces of different width.

13. The apparatus of claim 7, wherein at least the leading end in the direction of travel, of each holding element is designed as a plug coupling.

14. The apparatus of claim 13, and further comprising at least one intermediate transport assembly comprising an upward and downward conveyor, a plurality of substantially U-section pockets to said conveyor, the advancing means being arranged to feed the plug-coupling end of said holding element into a pocket of said conveyor, the first set of advancing means following a fixed path relative to the apparatus and the U-section pocket designed to receive the plug coupling end of said holding element advanced by said first set of advancing means having side walls spaced apart by substantially the width of the holding element whereby the latter is held snugly in its pocket, and the second set of advancing means following a path which can be moved relative to the first to accommodate workpieces of different widths, and the U-section pocket designed to receive the plug coupling end of said holding element advanced by said second set of advancing means being shaped as an open-ended U-section trough.

15. The apparatus of claim 14 wherein the upward and downward run of said conveyor are each inclined at an acute angle to the vertical so that the distance between the runs is smaller in the upper region of the conveyor than in the lower.

16. The apparatus of claim 15, which comprises in sequence, means for preheating said workpieces, being followed by means for coating one side of said workpiece, means for drying said coated side and being followed by a second coating means for coating the other side of said workpiece, drying means for preliminary and final drying of said coated workpiece, there being further first and second sets of advancing means for advancing said holding elements and the workpieces gripped thereby to the heating, coating and drying means in the aforementioned sequence.

17. The apparatus of claim 16, wherein each coating means also comprises means for preventing the application of coating material to said holding elements, said preventing means being controlled by means for sensing the width of a workpiece provided at said holding compartment.

18. The apparatus of claim 16, and further comprising a delivery track to receive the dried, coated workpieces and their holding elements, and means for opening the jaws of said holding elements to release the workpieces and means for transporting said holding elements back to said lift means at said holding compartment.

* * * * *